(12) United States Patent
Takeda

(10) Patent No.: US 8,748,979 B2
(45) Date of Patent: Jun. 10, 2014

(54) TRENCH LATERAL MOSFET HAVING A MULTI-PLANE GATE STRUCTURE

(71) Applicant: Renesas Electronics Corporation, Kawasaki (JP)

(72) Inventor: Hiroshi Takeda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/666,507

(22) Filed: Nov. 1, 2012

(65) Prior Publication Data
US 2013/0105813 A1 May 2, 2013

(30) Foreign Application Priority Data
Nov. 2, 2011 (JP) ................... 2011-240860

(51) Int. Cl.
*H01L 29/66* (2006.01)
(52) U.S. Cl.
USPC ........ 257/334; 257/330; 257/332; 257/E29.2; 257/E29.201; 257/E29.257; 257/E29.26
(58) Field of Classification Search
USPC .............. 257/330, 332, 334, E29.2, E29.201, 257/E29.257, E29.26
See application file for complete search history.

(56) References Cited

U.S. PATENT DOCUMENTS

| | | | | |
|---|---|---|---|---|
| 6,566,708 B1* | 5/2003 | Grover et al. | | 257/330 |
| 6,696,323 B2* | 2/2004 | Yamaguchi et al. | | 438/138 |
| 6,998,680 B2 | 2/2006 | Kitamura et al. | | |
| 7,439,579 B2* | 10/2008 | Sander et al. | | 257/330 |
| 7,564,099 B2* | 7/2009 | He et al. | | 257/341 |
| 7,633,099 B2* | 12/2009 | Hashimoto | | 257/213 |
| 7,646,058 B2* | 1/2010 | Hshieh | | 257/328 |
| 7,851,853 B2 | 12/2010 | Hikida et al. | | |
| 7,977,739 B2* | 7/2011 | Kachi | | 257/330 |
| 8,080,459 B2* | 12/2011 | Xu | | 438/270 |
| 8,247,865 B2* | 8/2012 | Hirler | | 257/339 |
| 8,278,706 B2* | 10/2012 | Takano | | 257/331 |
| 8,482,060 B2* | 7/2013 | Uchihara et al. | | 257/330 |
| 2004/0238882 A1* | 12/2004 | Suzuki et al. | | 257/330 |
| 2005/0145852 A1* | 7/2005 | Kumar et al. | | 257/77 |
| 2007/0040213 A1* | 2/2007 | Hotta et al. | | 257/330 |
| 2008/0050877 A1* | 2/2008 | de Fresart et al. | | 438/270 |
| 2012/0104493 A1* | 5/2012 | Denison et al. | | 257/339 |
| 2012/0248530 A1* | 10/2012 | Lui et al. | | 257/334 |
| 2012/0292689 A1* | 11/2012 | Wu et al. | | 257/330 |

FOREIGN PATENT DOCUMENTS

| | | | |
|---|---|---|---|
| JP | 2004-152979 A | 5/2004 | |
| JP | 2007-027641 A | 2/2007 | |
| JP | 2008-166717 A | 7/2008 | |
| JP | 2009-277956 A | 11/2009 | |

* cited by examiner

*Primary Examiner* — Ida M Soward
(74) *Attorney, Agent, or Firm* — Sughrue Mion, PLLC

(57) ABSTRACT

Disclosed is a semiconductor device whose breakdown voltage is made high by controlling local concentration of an electric field. A source region faces a second plane, one of side faces of a groove part, and a part thereof extends in a direction in parallel to a nodal line of first and second planes. A drift region faces a third plane being the other side face of the groove part opposite to the second plane with a part thereof extending in a direction parallel to the nodal line of the first plane and the third plane, and is formed at a lower concentration than the source region. The drain region is provided so as to be placed on the other side of the drift region opposite to the groove part and so as to touch the drift region, and is formed at a higher concentration than the drift region.

17 Claims, 23 Drawing Sheets

TRENCH LATERAL MOSFET HAVING A MULTI-PLANE GATE STRUCTURE

CROSS-REFERENCE TO RELATED APPLICATIONS

The disclosure of Japanese Patent Application No. 2011-240860 filed on Nov. 2, 2011 including the specification, drawings and abstract is incorporated herein by reference in its entirety.

BACKGROUND

The present invention relates to a semiconductor device and a method of manufacturing the semiconductor device.

In recent years, in order to make a semiconductor device have a high breakdown voltage, semiconductor devices of various structures are proposed.

Japanese Unexamined Patent Application No. 2004-152979 describes the following semiconductor device. Multiple trenches are formed in a width direction of a channel over a semiconductor substrate of a first conductivity type. A drain drift region of a second conductivity type is formed to surround side faces and a bottom of this trench. The interior of the trench is filled up with an insulator. Moreover, among the multiple trenches, an impurity region of the first conductivity type is formed. Thereby, it is supposed that ON-resistance per unit area can be reduced.

Moreover, Japanese Unexamined Patent Application No. 2007-027641 describes the following semiconductor device. A p-type body region is formed over a p-type semiconductor substrate. An $n^+$-type source region is formed in a surface region of the body region. An $n^+$-type drain region is formed over the semiconductor substrate. An $n^-$-type drift region is formed between the source region and the drain region. A gate insulating film is formed over the body region. A supplementary insulation film is formed over the drift region. A gate electrode is formed in parts on the gate insulating film and the supplementary insulation film. Furthermore, a silicide film is formed over the gate electrode, on the source region, and on the drain region. Thereby, it is supposed that a gate resistance can be sufficiently lowered and a high breakdown voltage can be achieved.

Moreover, Japanese Unexamined Patent Application No. 2008-166717 describes the following semiconductor device. A groove part is formed in an active region over a semiconductor substrate. On top faces of both sides that sandwich this groove part, two polysilicon layers into which impurities of a conductivity type reverse to that of the active region are provided. In the active regions that are placed on both sides that sandwich the groove part and are under the polysilicon layers, two drift layers into which impurities of a conductivity type reverse to that of the active regions are provided. A gate electrode is formed through a medium of the gate oxide film provided over the bottom and the side faces of the groove part. Moreover, in a portion that is not covered with the gate electrode of the two polysilicon layers, a source region and a drain region are formed. Thereby, it is supposed that a high-breakdown-voltage MOSFET can be reduced in size.

Moreover, Japanese Unexamined Patent Application No. 2009-277956 describes the following semiconductor device. Multiple trenches are formed in a stripe manner in a source-drain direction. A source region, a drift region with some distance from it, and a drain region are formed in this order over a top face region sandwiched by the trenches and a side face region. Thereby, it is supposed that a tradeoff relation between a breakdown voltage and an ON-resistance can be improved.

SUMMARY

However, technologies described in the above-mentioned patent documents were insufficient to make a semiconductor device have a high breakdown voltage.

According to the present invention, there is provided a semiconductor device that has: a semiconductor substrate whose surface is designated as a first plane; a groove part provided over the first plane side of the semiconductor substrate; a source region of a first conductivity type that faces a second plane that is one of the side faces of the groove part and at least a part of which lies at a position extending in a direction parallel to a nodal line of the first plane and the second plane; a drift region of the first conductivity type that faces a third plane being the other side face of the groove part opposite to the second plane, at least a part of which is provided extending in a direction parallel to a nodal line of the first plane and the third plane, and whose concentration is lower than that of the source region; a drain region of the first conductivity type that is placed at the other end of the drift region opposite to the groove part, is provided to touch the drift region, and whose concentration is higher than that of the drift region; a channel region that is provided over the semiconductor substrate and is sandwiched by the source region and the drift region in a plan view; a first gate insulating layer provided so that it may touch a fourth plane that is a plane lying in a direction of intersecting the second plane and the third plane and so that it may touch at least the channel region over the first plane; and a gate electrode provided over the first gate insulating layer; in which the groove part is formed more deeply than the drift region.

According to the present invention, a method of manufacturing a semiconductor device that has: a groove part formation step of forming a groove part on the first plane side of the semiconductor substrate; a step of forming a source region that faces the second plane that is one of side faces of the groove part at a position where at least a part thereof extends in a direction parallel to a nodal line of the first plane and the second line by implanting impurities of the first conductivity type; a step of forming the drain region at a position that is separated from the third plane being the other side face of the groove part opposite to the second plane by implanting impurities of the first conductivity type; a step of forming the drift region that touches the drain region and faces the third plane at a positron where at least a part thereof extends in a direction parallel to the nodal line of the first plane and the third plane by implanting impurities of the first conductivity type in a concentration lower than those of the source region and the drain region; a step of forming the first gate insulating layer so that it may touch a fourth plane that is a plane lying in a direction that intersects the second plane and the third plane among the side faces of the groove part and so that it may touch at least the channel region sandwiched by the source region and the drift region in a plan view over the first plane; and a step of forming a gate electrode over the first gate insulating layer; in which the groove part is formed more deeply than the drift region in the groove part formation step.

According to the present invention, the groove part is formed more deeply than the drift region. The gate electrode is provided so that it may overlap the channel region in a plan view over the fourth plane of the groove part and the first plane of the semiconductor substrate through the first gate insulating layer. By this, a potential by the gate electrode is formed down to a portion deeper than the drift region in the groove part. This potential by the gate electrode can restrain an electric field between the source region and the drain region from going round from the drift region to the channel region. Therefore, it is possible to provide the semiconductor device whose breakdown voltage is improved high by controlling so that the electric field may not concentrate locally.

According to the present invention, it is possible to provide the semiconductor device whose breakdown voltage is improved high by controlling so that the electric field may not concentrate locally.

BRIEF DESCRIPTION OF THE DRAWINGS

FIGS. 2A, 2B, and 2C are diagrams showing the configuration of the semiconductor device according to the first embodiment, in which FIG. 2A is a top view showing the configuration of the semiconductor device 10, FIG. 2B is a sectional view taken along a B-B' line, and FIG. 2C is a sectional view taken along an A-A' line;

FIGS. 4A and 4B are sectional views showing the configuration of the semiconductor device according to the first embodiment, in which FIG. 4A is the sectional view taken along a C-C' line, and FIG. 4B is the sectional view taken along a D-D' line;

FIGS. 13A and 13B are diagrams for explaining an effect of the first embodiment, in which FIG. 13A shows the case of the comparative example and FIG. 13B shows the case of the first embodiment;

FIGS. 14A and 14B are diagrams for explaining the effect of the first embodiment, in which FIG. 14A shows the case of a comparative example and FIG. 14B shows the case of the first embodiment;

FIGS. 18A and 18B are sectional views for explaining a method of manufacturing a semiconductor device according to the third embodiment, in which FIG. 18A shows formation of a source region, a drift region, and a drain region on a first plane side of a semiconductor substrate and FIG. 18B shows formation of a first mask layer and a second mask layer;

FIGS. 19A and 19B are sectional views for explaining the method of manufacturing a semiconductor device according to the third embodiment, in which FIG. 19A shows embedding of an insulating layer at least in an opening by CVD and FIG. 19B shows flattening of the top of the first plane of the semiconductor substrate by CMP;

FIGS. 20A and 20B are sectional views for explaining the method of manufacturing a semiconductor device according to the third embodiment, in which FIG. 20A shows formation of a first gate insulating layer over the first plane side of the semiconductor substrate and FIG. 20B shows formation of a metallic film over the first gate insulating layer;

FIGS. 22A and 22B are sectional views for explaining a method of manufacturing a semiconductor device according to the fourth embodiment, in which FIG. 22A shows steps up to FIG. 10 that are performed similarly with the first embodiment and FIG. 22B shows formation of a second gate insulating layer over the first plane of the semiconductor substrate and in the interior of the groove part by CVD;

FIGS. 23A and 23B are sectional views for explaining the method of manufacturing a semiconductor device according to the fourth embodiment, in which FIG. 23A shows formation of an opening at a position in the second gate insulating layer by plasma etching or wet etching and FIG. 23B shows formation of the first gate insulating layer at least in the interior of the opening;

PREFERRED EMBODIMENT

Figure 1:
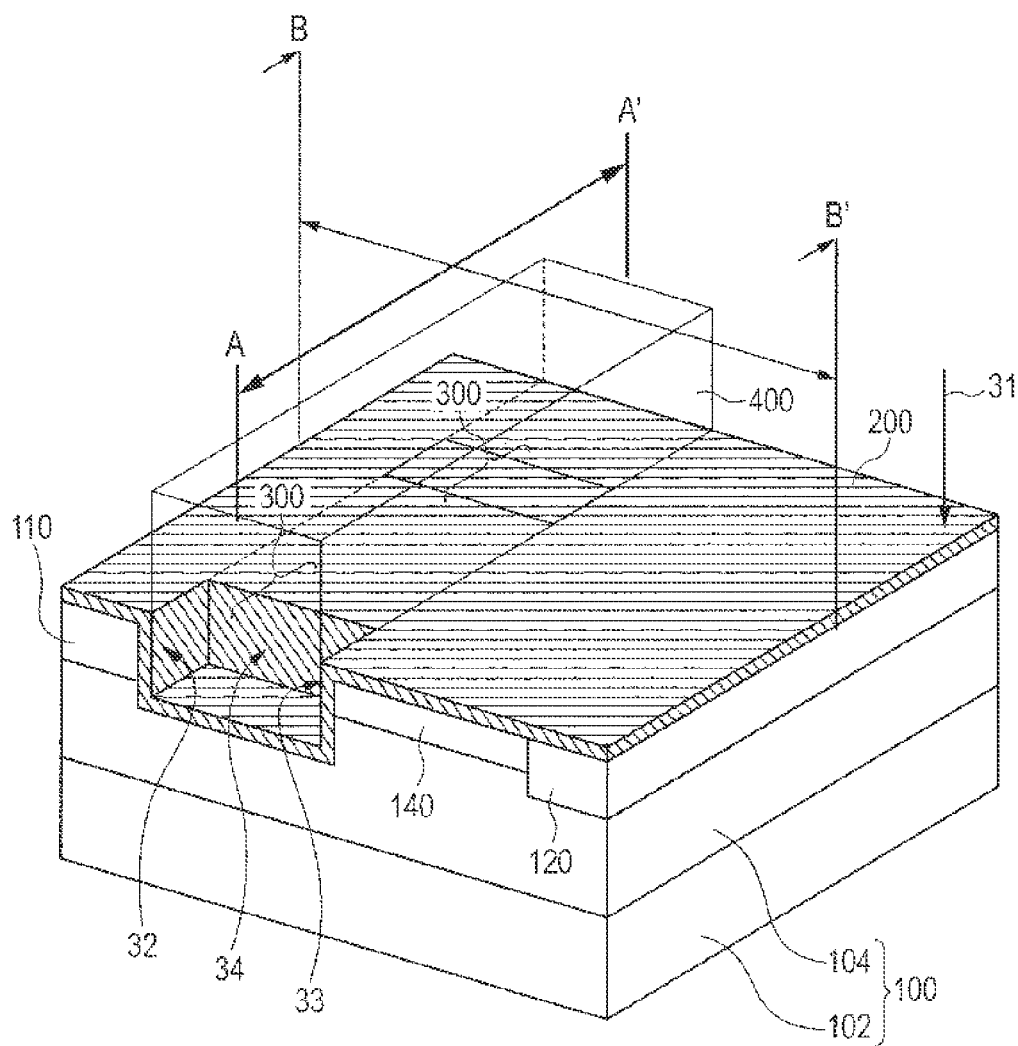
FIG. 1 is a bird's-eye view showing a configuration of a semiconductor device according to a first embodiment.

Hereinafter, embodiments of the present invention will be explained using drawings. Incidentally, in all the drawings, the same symbol is given to the same component and its explanation is omitted appropriately.

First Embodiment

A semiconductor device 10 according to a first embodiment will be described using FIG. 1 to FIG. 5. This semiconductor device 10 has the following configuration. A groove part 300 is formed over a first plane 31 side of a semiconductor substrate 100. A source region 110 of a first conductivity type faces a second plane 32 that is one of side faces of the groove part 300, and at least a part thereof extends in a direction parallel to a nodal line of the first plane 31 and the second plane 32. A drift region 140 of the first conductivity type faces a third plane 33 being the other side face of the groove part 300 opposite to the second plane 32, is provided so that at least a part thereof may extend in a direction parallel to a nodal line of the first plane 31 and the third plane 33, and is formed at a lower concentration than the source region 110. A drain region 120 of the first conductivity type is placed on the other side of the drift region 140 opposite to the groove part 300, is provided to touch the drift region 140, and is formed in a higher concentration than the drift region 140. A channel region 130 is provided over the semiconductor substrate 100, and is formed in a region sandwiched by the source region 110 and the drift region 140 in a plan view. A first gate insulating layer 200 is provided so that it may touch a fourth plane that is a plane lying in a direction that intersects the second plane 32 and the third plane 33 among the side faces of the groove part 300 and so that it may touch at least the channel region 130 among regions over the first plane 31. A gate electrode 400 is provided over the first gate insulating layer 200. Moreover, the groove part 300 is formed more deeply than the drift region 140. Below, details will be explained.

First, an outline of the semiconductor device 10 will be explained using FIG. 1. FIG. 1 is a bird's-eye view showing a configuration of the semiconductor device 10 according to the first embodiment.

As in FIG. 1, the semiconductor device 10 is a lateral MOSFET. This semiconductor device 10 is used, for example, as an IC for power supply to which a voltage not less than 10 V and less than 1000 V is applied. Specifically, the semiconductor device 10 is used as ICs for power supply of a computer, a vehicular electronic device, a consumer electronics device, or a communication device. Moreover, depending on the configuration, such as the length of a direction going from the source region 110 toward the drain region 120 in the drift region 140 that will be described later and the concentration of the impurities, this can be used for an electric power apparatus capable of being applied a high voltage of 1000 V or more, an electric power converter for conveyance apparatus, etc.

Here, a surface of the semiconductor substrate 100 is designated as the first plane 31. In the first embodiment, at least the first plane 31 side of the semiconductor substrate 100 is a group III nitride semiconductor layer 104 comprised of a group III nitride semiconductor, for example. The semiconductor substrate 100 has, for example, a base substrate 102 and the group III nitride semiconductor layer 104 including the group III nitride semiconductor. The group III nitride semiconductor layer 104 is provided over the first plane 31 of the base substrate 102. The base substrate 102 is, for example, a Si substrate, a sapphire substrate, a SiC substrate, or a GaN substrate (bulk GaN substrate). Preferably, the base substrate 102 is a Si substrate, for example. Thereby, when manufacturing the semiconductor device 10, the semiconductor manufacturing device for a Si system can be diverted.

The buffer layer (unillustrated) may be provided between the base substrate 102 and the group III nitride semiconductor layer 104. For the buffer layer, a suitable material is used based on a difference of the lattice constant between the base substrate 102 and the group III nitride semiconductor layer 104. Specifically, the buffer layer is an AlGaN layer or its lamination structure, for example.

The source region 110, the channel region 130 (after-mentioned), the drift region 140, and the drain region 120 are formed over the first plane 31 side of the semiconductor substrate 100, i.e., in the group III nitride semiconductor layer 104. By this, a lateral MOSFET is formed. Here, the group III nitride semiconductor has high breakdown voltage and saturated drift velocity as compared with the semiconductor device of a Si system. Thereby, a low loss switching element with a high breakdown voltage can be formed. Specifically, the group III nitride semiconductor layer 104 is a GaN layer, for example. Moreover, an orientation of the normal direction (the first plane 31) of the semiconductor substrate 100 among orientations of the group III nitride semiconductor layer 104 is, for example, (0001) (c-plane).

Here, in the case where an FET is formed in the group III nitride semiconductor layer 104, the FET is an n-channel type. However, it may be a p-channel type.

The group III nitride semiconductor layer 104 is, for example, an intrinsic semiconductor. In other words, impurities are not implanted into any regions other than the source region 110, the drift region 140, and the drain region 120 in the group III nitride semiconductor layer 104. That is, a p-type impurity region is not formed in the region. Moreover, at least the impurity concentration of the channel region 130 is, for example, less than or equal to $1 \times 10^{16}$ atoms/cm$^3$. In such a case, the semiconductor device 10 can be made to have a notably high breakdown voltage because it has a configuration thereof that will be described latter.

Moreover, the source region 110, the drift region 140, and the drain region 120 are n-type, for example. That is, the above-mentioned "first conductivity type" is the n-type, for example. The n-type impurity is Si, for example. Thereby, in the group III nitride semiconductor layer 104, the n-channel type FET can be easily formed.

Incidentally, when referring to the "semiconductor substrate 100" below, unless otherwise specifically noted, it includes being the "group III nitride semiconductor layer 104 over the semiconductor substrate 100." Moreover, it is presupposed that the "first conductivity type" is n-type.

Here, the groove part 300 is formed over the first plane 31 side of the semiconductor substrate 100. Moreover, the groove part 300 is rectangular, for example. A plane on the source region 110 side among the side faces of the groove part 300 is designated as a second plane 32. Moreover, a plane that is on a drift region 140 side opposite to the second plane is designated as the third plane 33. Furthermore, a plane lying in a direction that intersects the second plane 32 and the third plane 33 is designated as a fourth plane 34. Incidentally, the "fourth plane 34" is used to indicate both fourth planes 34 facing each other. In addition, the groove part 300 may be in a trapezoidal shape, a rhombus shape, or a polygon shape, for example. In this case, there may be multiple second planes 32, multiple third planes 33, and multiple fourth planes 34, respectively. In such a case, each plane shall be defined by the adjacent impurity region (or channel region 130).

The source region 110 is formed over the semiconductor substrate 100 so that it may face the second plane 32. On the other hand, the drift region 140 and the drain region 120 are formed over the third plane 33 side in this order. The first gate insulating layer 200 is formed, for example, in the interior of the groove part 300 and over the first plane 31. Moreover, the gate electrode 400 is formed so that it may overlap the fourth plane 34 of the groove part 300, and the channel region 130 over the first plane 31 of the semiconductor substrate 100 in a plan view through the first gate insulating layer 200. In the following, this point will be explained further.

Figure 2A:
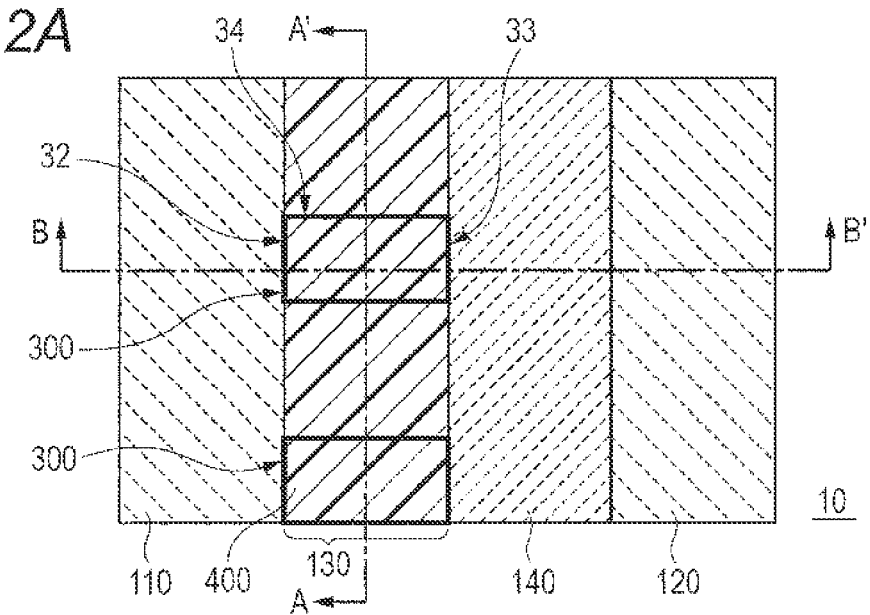
Figure 2B:
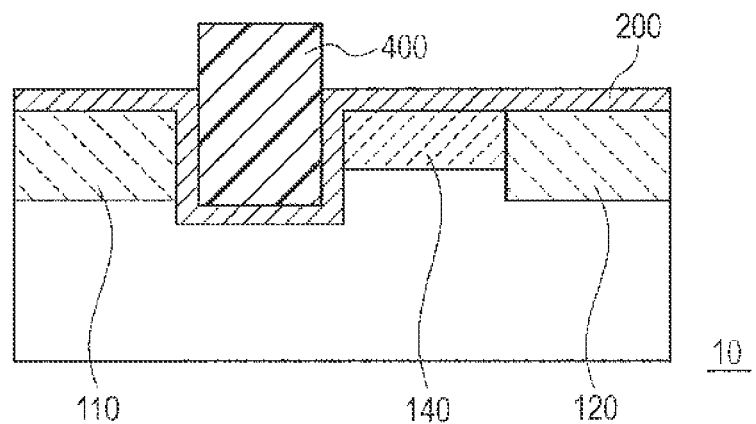
Figure 2C:
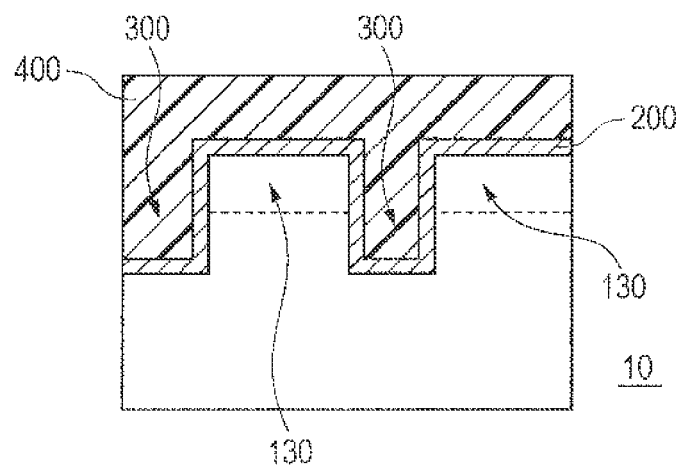

Next, details of each configuration of the semiconductor device 10 will be explained using FIG. 2. FIG. 2 is a diagram showing the configuration of the semiconductor device 10 according to the first embodiment. FIG. 2A is a top view showing the configuration of the semiconductor device 10 that is seen from the first plane 31 side of the semiconductor substrate 100. In the diagram, a thick solid line shows the groove part 300. Moreover, the first gate insulating layer 200 is omitted in FIG. 2A. FIG. 2B is a sectional view taken along a B-B' line seen from an arrow side of FIG. 1 or FIG. 2A. FIG. 2C is a sectional view taken along an A-A' line of FIG. 1 or FIG. 2A. In FIG. 2C, a dotted line shows a lower limit of the drift region 140.

As in FIG. 2A, the n-type source region 110 faces the second plane 32 of the groove part 300, and at least a part thereof extends in a direction parallel to the nodal line of the first plane 31 and the second plane 32. A "state where the source region 110 faces the second plane 32" mentioned here means that the side face of the source region 110 on the groove part 300 side faces (opposes) the second plane 32. That is, a state where "the source region 110 faces the second plane 32" includes a state where the source region 110 touches the second plane 32," for example. Moreover, the state may be a state where the source region 110 is separated from the second plane 32 and opposes the second plane 32, for example. Moreover, the state may be a state where none of the side faces on the groove part 300 side in the source region 110 face the second plane 32, and a state where these should be is just a state where a part of the source region 110 on the groove part 300 side faces the second plane 32.

Moreover, the state where "at least a part of the source region 110 mentioned here extends in a direction parallel to the nodal line of the first plane 31 and the second plane 32" includes not only a state where the whole of the source region 110 extends in a direction parallel to the nodal line of the first plane 31 and the second plane 32 but also a state where a part of the source region 110 extends in a direction parallel to the nodal line of the first plane 31 and the second plane 32. The source region 110 may extend in a direction perpendicular to the second plane 32 in a plan view. Moreover, the groove part 300 may enter into the source region 110 side in a plan view.

The drift region 140 faces the third plane 33 of the groove part 300, and at least a part thereof extends in a direction parallel to the nodal line of the first plane 31 and the third plane 33. The "state where the drift region 140 faces the third plane 33" mentioned here is the same as a relationship between the source region 110 and the second plane 32, as described above. Moreover, the "state where at least a part of the drain region 120 extends in a direction parallel to the nodal line of the first plane 31 and the third plane 33" is also the same as a relationship between the source region 110 and the nodal line of the first plane 31 and the second plane 32, as described above.

Here, the n-type the drift region 140 is provided separated away from the source region 110 by, for example, a width of the groove part 300 in a plan view. On the other hand, the groove part 300 may enter into a part of the drift region 140 in a plan view. In other words, an end of the drift region 140 on the source region 110 side may be arranged on the source region 110 side away from the third plane 33 of the groove part 300 in a plan view.

The channel region 130 is formed in the region sandwiched by the source region 110 and the drift region 140 in a plan view over the semiconductor substrate 100. The "channel region 130" mentioned here means a region where carriers are transmitted between the source region 110 and the drift region 140. The n-type drain region 120 is placed on the other side of the drift region 140 opposite to the groove part 300. Moreover, the drain region 120 touches the drift region 140. On the contrary, there is no portion of the drain region 120 that directly touches the channel region 130.

Moreover, in the case where at least the first plane 31 side of the semiconductor substrate 100 is the group III nitride semiconductor layer 104, a direction going from the source region 110 toward the drain region 120 is a [2-1-10] direction or [01-10] direction. Here, the "direction that goes from the source region 110 toward the drain region 120" is a so-called channel length direction. Alternatively, in the first embodiment, the "direction that goes from the source region 110 toward the drain region 120" is a direction parallel to the fourth plane of the groove part 300. As will be described later, the groove part 300 is formed by etching the first plane 31 side of the semiconductor substrate 100. By forming thus the side faces of the groove part 300 in parallel to a crystalline axis orientation, the groove part 300 in a rectangular shape can be easily formed in the group III nitride semiconductor layer 104. Moreover, the fourth plane 34 that is flat in an atomic level can be formed. Therefore, an electric field by the gate electrode 400 that will be described later can be inhibited from concentrating locally on the fourth plane 34 of the groove part 300.

The gate electrode 400 is provided to overlap the channel region 130 in a plan view among regions over the fourth plane of the groove part 300 and the first plane 31 of the semiconductor substrate 100 through the first gate insulating layer 200. Incidentally, the gate electrode 400 may be formed in the entire interior of the groove part 300. Here, the gate electrode 400 is provided over the second plane 32, the third plane 33, the fourth plane 34, and a bottom of the groove part 300, for example. Moreover, a material of the gate electrode 400 is Al and/or TiN, for example.

The length of a direction that goes from the source region 110 toward the drift region 140 in the channel region 130 is decided based on desired ON-resistance and OFF-resistance, a magnitude of a drain-source current, or the like. Specifically, the length in the channel region 130 that goes from the source region 110 toward the drift region 140 is not less than 100 nm and less than 10 μm, for example.

The length that goes from the source region 110 toward the drain region 120 in the drift region 140 is also decided based on the desired ON-resistance and OFF-resistance, the magnitude of the drain-source current, or the like. Specifically, the length that goes from the source region 110 toward the drain region 120 in the drift region 140 is, for example, not less than 100 nm and less than 10 μm.

As in FIG. 2B, the source region 110 touches the second plane 32 of the groove part 300 not only in a plan view but also in a depth direction, for example. Here, a region into which the impurities are introduced, such as the source region 110, is formed by ion implanting n-type impurities, for example. Moreover, the "range into which the impurities are introduced" of the "source region 110" etc. mentioned here means a region whose impurity concentration is $1\times10^{16}$ atoms/cm$^3$ or more in the semiconductor substrate 100. In other words, the "range into which the impurities are introduced" means a region whose impurity concentration is 10 times or more as high as the impurity concentration of the semiconductor substrate 100. Incidentally, if there is no difference in impurity concentration between the region and the semiconductor substrate 100, the "range into which the impurities are introduced" may be a region that covers a vertex at which the impurity concentration is highest to a σ point (here, σ is a standard deviation of a Gaussian distribution of the impurity concentration that is assumed). Incidentally, the above-mentioned definition of the "range into which the impurities are introduced" shall be applied to "the "source region 110," the "drift region 140," and the "drain region 120." Moreover, the definition is applied to the above-mentioned length in a plan view and to the depth in a direction perpendicular to the first plane 31 of the semiconductor substrate 100 in the region into which the impurities are introduced.

The drift region 140 also touches the third plane 33 of the groove part 300 not only in a plan view but also in the depth direction, for example. The drift region 140 is formed at a lower concentration than the source region 110. Here, the lower limit of the drift region 140 is a position at which the impurity concentration of the drift region 140 is lower than the impurity concentration of the first plane 31 side by $10^4$ or more, for example. Moreover, the drift region 140 is formed more shallowly than the source region 110, for example. Specifically, the depth of the drift region 140 is not less than 100 nm and less than 500 nm, for example.

Moreover, the groove part 300 is formed more deeply than the drift region 140. Thereby, as will be described later, the electric field is formed by the gate electrode 400 to a portion deeper than the drift region 140 among portions of the groove part 300. Therefore, the electric field that extends to the channel region 130 going round from the drift region 140 can be inhibited. Incidentally, the groove part 300 may be deeply formed, for example, as compared with the source region 110.

Moreover, it is desirable that the groove part 300 is formed, for example, 1.5 times or more as deep as the drift region 140. Specifically, the depth of the groove part 300 is not less than 150 nm and less than 750 nm, for example. Thereby, the above-mentioned going-round electric field can be inhibited still more certainly.

The second plane 32 and the third plane 33 of the groove part 300 are provided, for example, perpendicularly to the first plane 31. Thereby, an area of the channel region 130 in a plan view can be made small. Incidentally, the second plane 32 and the third plane 33 of the groove part 300 may touch the first plane 31 by an acute angle or an obtuse angle.

The drain region 120 is formed more deeply than the drift region 140, for example. On the other hand, as will be described later, the drain region 120 may be formed more shallowly than the drift region 140.

Moreover, the drain region 120 is formed similarly with the source region 110 and has a higher impurity concentration than the drift region 140. It is desirable that the impurity concentrations of the source region 110 and the drain region 120 be 10 times or more as high as that of the drift region 140. Specifically, it is desirable that when the impurity concentrations of the source region 110 and the drain region are more than or equal to $1 \times 10^{21}$ atoms/cm$^3$, the impurity concentration of the drift region 140 be less than $1 \times 10^{20}$ atoms/cm$^3$. This can inhibit concentration of the electric field by the source-drain voltage.

As in FIG. 2C, the first gate insulating layer 200 is provided so that it may touch the fourth plane among the side faces of the groove part 300 and so that it may touch at least the channel region 130 among regions over the first plane 31. Here, in the case where multiple fourth planes exist, what is necessary is just that a part of the first gate insulating layer 200 should touch the fourth plane 34. Moreover, as described above, the gate electrode 400 is formed over the first gate insulating layer 200. Moreover, the gate electrode 400 does not touch directly any of the second plane 32, the third plane 33, and the fourth plane 34 of the groove part 300.

As in FIG. 2B, the first gate insulating layer 200 may be formed further in contact with the second plane 32 and the third plane 33 of the groove part 300, for example. Thereby, the gate electrode 400 touches directly neither of the source region 110 and the drift region 140. That is, it can inhibit the current from leaking by the electric field by the gate electrode between the gate electrode and the drift electrode. Here, the first gate insulating layer 200 is provided in contact with the first plane 31, the second plane 32, the third plane 33, and the fourth plane 34, and the bottom of the groove part 300. In other words, the source region 110 or the drift region 140 touches the gate electrode 400 through the first gate insulating layer 200, for example. Here, the first gate insulating layer 200 is SiO$_2$, SiN, or Al$_2$O$_3$ that is formed by sputtering, for example. In addition, the gate insulating layer 200 may be formed with a high dielectric constant material, such as Ta$_2$O$_5$.

Here, multiple groove parts 300 are formed, for example. The multiple groove parts 300 are arranged, for example, in a direction parallel to the nodal line of the first plane 31 and the second plane 32, and are provided mutually separated. The channel region 130 is formed between the adjacent groove parts 300. In other words, the multiple groove parts 300 are arranged side by side in a channel width direction. The "channel width direction" mentioned here is a direction parallel to the second plane 32. Alternatively, the "channel width direction" is a direction that is in parallel to the first plane 31 of the semiconductor substrate 100 and that minimizes a distance between the source region 110 and the drain region 120. Thus, there are provided a portion in which the groove part 300 is formed and a portion in which the groove part 300 is not formed in the channel width direction. Thereby, by forming multiple portions deeper than the drift region 140 in the groove part 300, portions each for inhibiting the electric field that extends to the channel region 130 after going round from the drift region 140 to the channel region 130 can be increased. That is, it is possible to enhance an effect of inhibiting the electric field that extends in the channel region 130 after going round from the drift region 140 to there.

The width in the channel width direction in the groove part 300 is not less than 100 nm and less than 500 nm. By the width being not less than the above-mentioned lower limit, an effect of inhibiting the electric field can certainly be achieved. Moreover, by the width being less than the above-mentioned upper limit, and by the groove part 300 having been provided, the ON-resistance can be inhibited from rising.

Moreover, when the multiple groove parts 300 are provided, an interval of the groove parts 300 is not less than 100 nm and less than 500 nm. By the width being not less than the above-mentioned lower limit and by the interval of the groove part 300 being thus narrow, it can be controlled for the ON-resistance can be inhibited from rising. Moreover, by the width being less than the above-mentioned upper limit and by the groove parts 300 being provided contiguously, it is possible to further alleviate the electric field.

Figure 3:
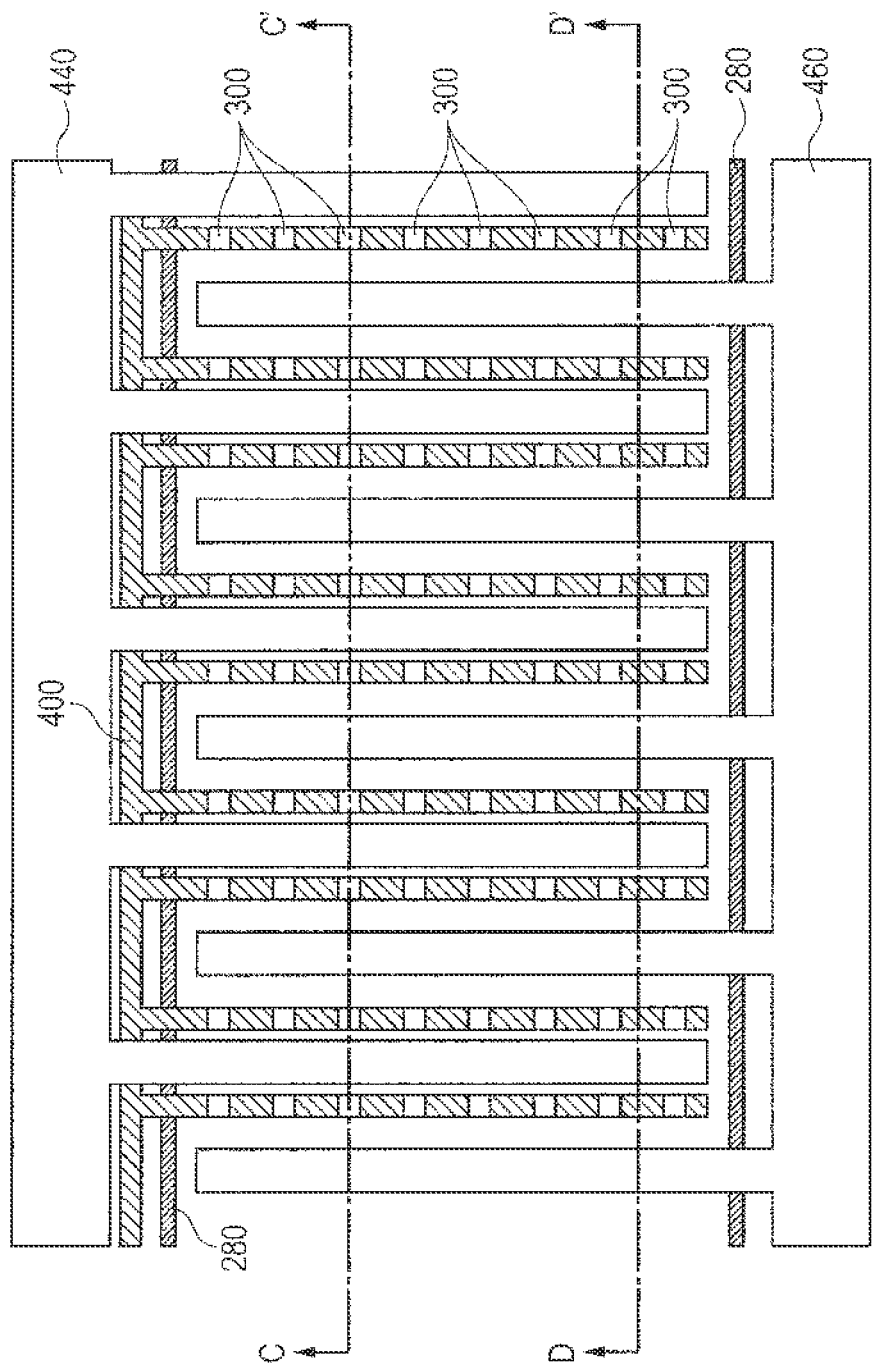
FIG. 3 is a plan view showing the configuration of the semiconductor device according to the first embodiment.
Figure 4A:
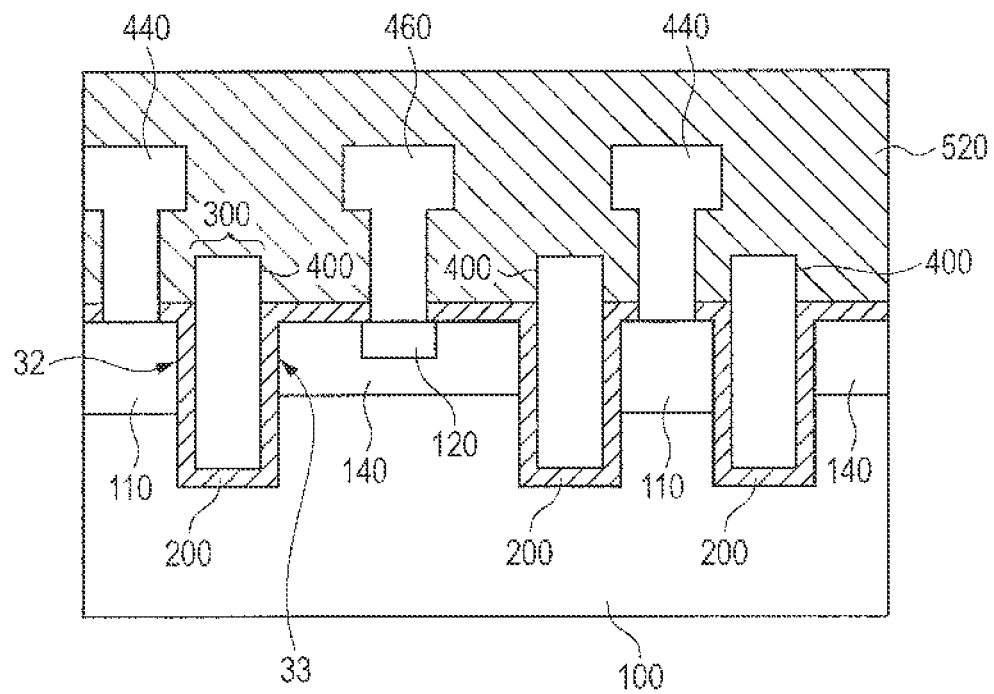

Next, an entire structure of the semiconductor device 10 will be explained using FIG. 3 and FIG. 4. FIG. 3 is a plan view showing a configuration of a semiconductor device according to the first embodiment. FIGS. 4A and 4B are sectional views showing the configuration of the semiconductor device according to the first embodiment, in which FIG. 4A is the sectional view taken along a C-C' line of FIG. 3, and FIG. 4B is the sectional view taken along a D-D' line of FIG. 3.

As in FIG. 3, wirings of a source electrode 440 and of a drain electrode 460 are provided in a comb teeth form in a plan view, for example, and are provided alternately separated from each other. The gate electrode 400 is provided, for example, in a comb teeth form in a plan view, and is provided between the source electrode 440 and the drain electrode 460. The gate electrode 400 is provided separated from the source electrode 440 and the drain electrode 460, respectively. Moreover, the groove part 300 of a rectangular shape is formed aligning in parallel to the gate electrode 400 in a plan view.

An element isolation region 280 is provided on the first plane 31 side of the semiconductor substrate 100. The element isolation region 280 is provided, for example, in order to partition multiple element regions. Here, it is provided, for example, to surround a region where the above-mentioned lateral MOSFET was formed in a plan view. An IC for control may be formed in an other element region among regions of the same semiconductor substrate 100. Moreover, the depth of the element isolation region 280 may be equal to that of the groove part 300. This enables the groove part 300 and the element isolation region 280 to be formed simultaneously. That is, a manufacturing process can be simplified.

The element isolation region 280 is an STI (Shallow Trench Isolation), for example. Specifically, the element isolation region 280 is of $SiO_2$, for example. Alternatively, the element isolation region 280 may be formed, for example, by a method that does not activate the semiconductor substrate 100 by implanting impurities that make it highly resistive. "The impurities that make the semiconductor substrate 100 highly resistive" mentioned here are impurities that compensate both electrons and holes.

FIG. 4A shows a region where the groove part 300 is formed. As in FIG. 4A, a first interlayer insulating layer 520 is provided to cover the gate electrode 400 and the first gate insulating layer 200. The first interlayer insulating layer 520 is, for example, $SiO_2$, SiN, SiON, SiOC, SiOCH, SiCOH, SiOF, or the like.

The source electrode 440 and the drain electrode 460 each have a via (symbol not illustrated) whose one end touches the first plane 31 of the semiconductor substrate 100 and wiring (symbol not illustrated) whose underside touches the other end of the via. The via of the source electrode 440 is provided to overlap the source region 110 in a plan view, penetrates the first interlayer insulating layer 520 and the first gate insulating layer 200, and couples with the source region 110. Moreover, the via of the drain electrode 460 is provided to overlap the drain region 120 in a plan view, penetrates the first interlayer insulating layer 520 and the first gate insulating layer 200, and couples with the drain region 120. Here, wiring of the source electrode 440 and the drain electrode 460 is formed over the same wiring layer, for example. Moreover, a material of the source electrode 440 and the drain electrode 460 is Al, TiN, or the like, for example.

On the other hand, wiring (symbol not illustrated) of the gate electrode 400 extends in a direction perpendicular to the sheet plane. The wiring of the gate electrode 400 is formed, for example, over a wiring layer different from the wiring layer over which the wiring of the source electrode 440 and the drain electrode 460 are provided.

Incidentally, although FIG. 1 and FIG. 2 showed the case where the drain region 120 was formed more deeply than the drift region 140, for example; the drain region 120 may be formed more shallowly than the drift region 140 as in FIG. 4, for example. At this time, the underside of the drain region 120 touches the drift region 140, for example. Moreover, the drift region 140 is formed to overlap the drain region 120 in a plan view. Incidentally, irrespective of the depth of the drain region 120, a portion of the drain region 120 that touches the groove part 300 or the channel region 130 is not formed.

Figure 4B:
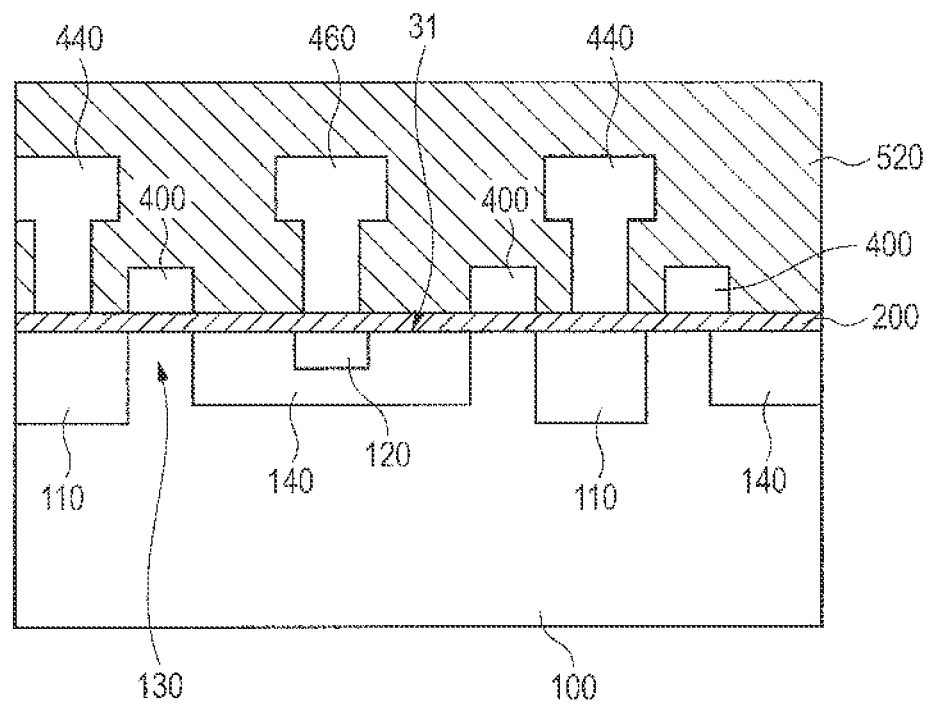

FIG. 4B shows a region where the groove part 300 is not formed. As in FIG. 4B, the first gate insulating layer 200 is formed over the whole of the first plane 31 of the semiconductor substrate 100. A channel region 130 is formed between the source region 110 and the drift region 140 among portions where the groove part 300 is not formed. The gate electrode 400 is formed to overlap the channel region 130 in a plan view.

Figure 5:
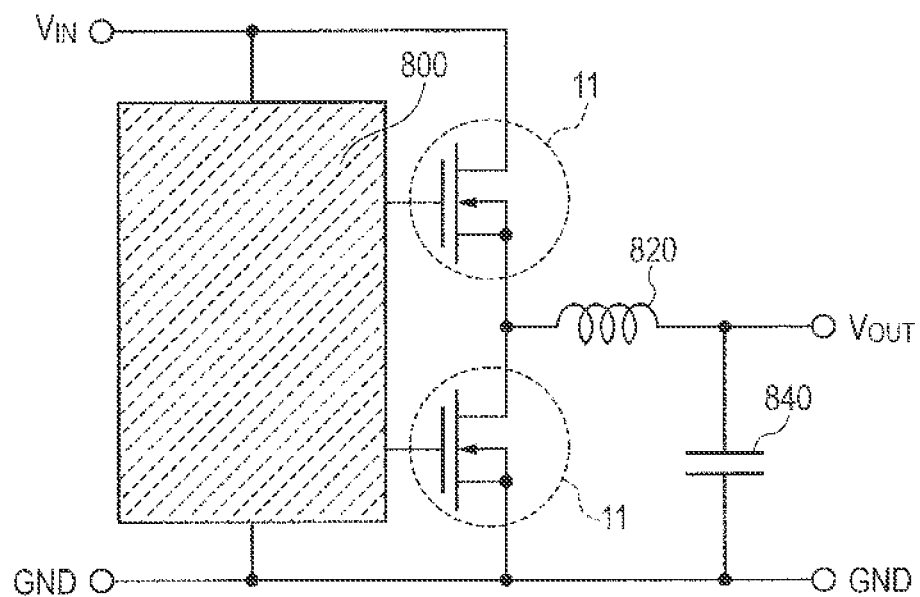
FIG. 5 is a circuit diagram showing the configuration of the semiconductor device according to the first embodiment.

Next, a circuit of the semiconductor device 10 according to the first embodiment will be explained using FIG. 5. FIG. 5 is a circuit diagram showing a configuration of the semiconductor device 10 according to the first embodiment. As in FIG. 5, the semiconductor device 10 of the first embodiment is a DC-DC converter, for example. This circuit is a step down converter, for example. This semiconductor device 10 has a DC-DC controller IC 800, two n-channel FETs 11, an inductor 820, and a capacitor 840, for example. The two n-channel FETs 11 are coupled in series between the $V_{IN}$ and the GND.

Moreover, this n-channel FET 11 is the FET shown in FIG. 1, for example. A gate voltage of the n-channel FET 11 is controlled by the DC-DC controller IC 800. $V_{OUT}$ is taken out from between the two n-channel FETs 11 through an inductor 820. Incidentally, a mid point between the inductor 820 and the $V_{OUT}$ is coupled to the GND through the capacitor 840. Moreover, a DC-DC controller IC 800 converts a DC signal inputted from $V_{IN}$ into pulses, for example. By the converted pulses, the n-channel FET 11 repeats operations of storing energy in the inductor 820 and of subsequently releasing the energy to the $V_{OUT}$ alternately. According to the first embodiment, the n-channel FET 11 can exhibit a switching function stably.

Next, the method of manufacturing a semiconductor device 10 according to the first embodiment will be explained using FIG. 6 to FIG. 12. FIG. 6 to FIG. 12 are bird's-eye views for explaining the method of manufacturing a semiconductor device according to the first embodiment. The method of manufacturing a semiconductor device according to the first embodiment has the following steps. First, the groove part 300 is formed over the first plane 31 side of the semiconductor substrate 100 (a groove part formation step). Next, the source region 110 that faces the second plane 32 being one of the side faces of the groove part 300 is formed at a position where at least a part thereof extends in a direction parallel to the nodal line of the first plane 31 and the second plane 32 by implanting impurities of the first conductivity type. Next, the drain region 120 is formed by implanting impurities of the first conductivity type at a position separated from the third plane 33 being the other side face of the groove part 300 opposite to the second plane 32. Next, the drift region 140 that faces the both the drain region 120 and the third plane 33 is formed by implanting impurities of the first conductivity type at a smaller concentration than the source region 110 and the drain region 120 at a position where at least a part thereof extends in a direction parallel to the nodal line of the first plane 31 and the third plane 33. Next, the first gate insulating layer 200 is formed so as to touch the forth plane 34 that is a plane lying in a direction that intersects the second plane 32 and the third plane 33 among the side faces of the groove part 300 and so as to touch at least the channel region 130 sandwiched by the source region 110 and the drift region 140 in a plan view over the first plane 31. Next, a gate electrode is formed over the first gate insulating layer 200. Here, in the groove part formation step, the groove part 300 is formed to be deeper than the drift region 140. Below, details will be explained.

Figure 6:
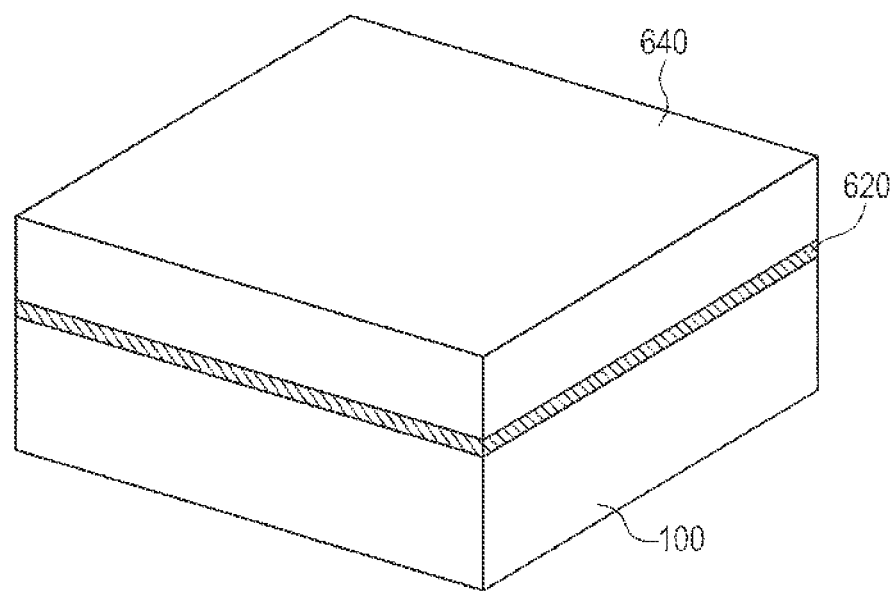
FIG. 6 is a bird's-eye view for explaining a method of manufacturing a semiconductor device according to the first embodiment.

As in FIG. 6, the semiconductor substrate 100 is prepared first. Although being omitted in FIG. 6, the semiconductor substrate 100 has the group III nitride semiconductor layer 104 over the first plane 31 of the base substrate 102, as shown in FIG. 1. Here, the group III nitride semiconductor layer 104 is GaN, for example. Next, a first mask layer 620 is formed over the semiconductor substrate 100. Furthermore, a second mask layer 640 is formed over the first mask layer 620. Here, the first mask layer 620 and the second mask layer 640 are $SiO_2$ and SiN, respectively, for example. Incidentally, the first mask layer 620 and the second mask layer 640 are formed by, for example, CVD (Chemical Vapor Deposition) or sputtering. On the other hand, the first mask layer 620 may be formed by oxidizing the surface of the semiconductor substrate 100, for example. Specifically, the first mask layer 620 is $Ga_2O_3$, for example.

Figure 7:
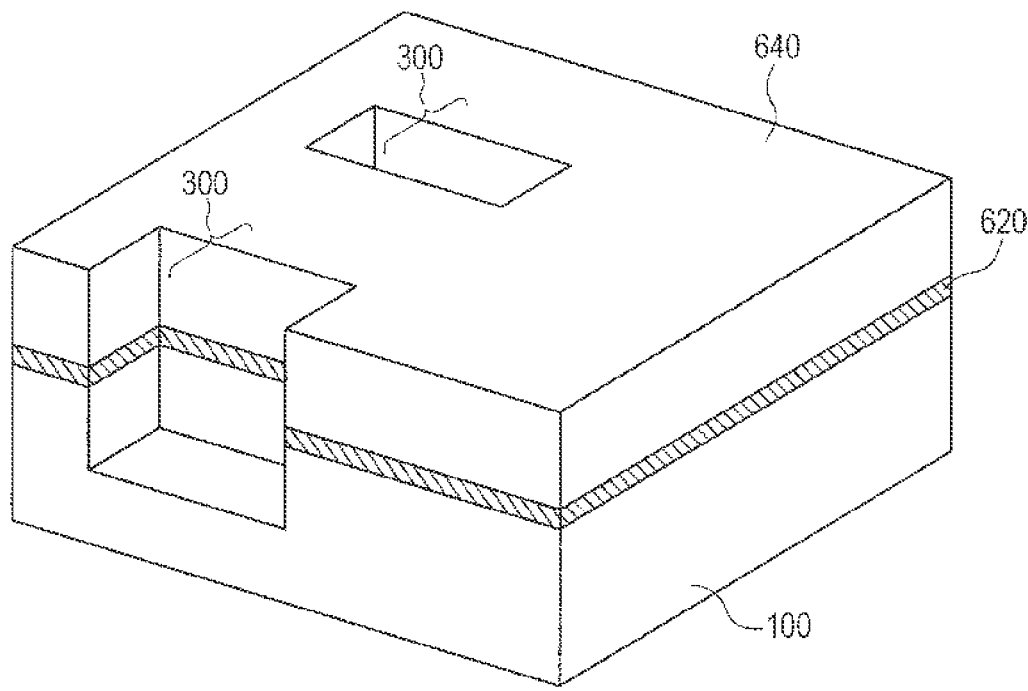
FIG. 7 is a bird's-eye view for explaining the method of manufacturing a semiconductor device according to the first embodiment.

Next, as in FIG. 7, a photoresist layer (unillustrated) is formed over the second mask layer 640. Next, an opening (unillustrated) of the photoresist layer is formed in a formation region of the groove part 300 in a plan view by exposure and development. Next, the first mask layer 620, the second mask layer 640, and the first plane 31 of the semiconductor substrate 100 that are exposed in the opening are etched by RIE (Reactive Ion Etching). As an etching gas, gas of a chloride system is used, for example. Specifically, the etching gas is, for example, $Cl_2$ and $BCl_3$. With this, the groove part 300 is formed over the first plane 31 side of the semiconductor substrate 100 (the groove part formation step). In this groove part formation step, the groove part 300 is formed to be deeper than the drift region 140. In other words, in a step of forming the drift region 140 that will be described later, the drift region 140 is formed to be shallower than the groove part 300. Next, the photoresist layer is removed by, for example, asking, etc.

By the above steps, the groove part 300 is formed so that the length (the length of the fourth plane 34 mentioned here) in a direction going from the source region 110 toward the drain region 120 may become not less than 100 nm and less than 10 μm, for example.

Figure 8:
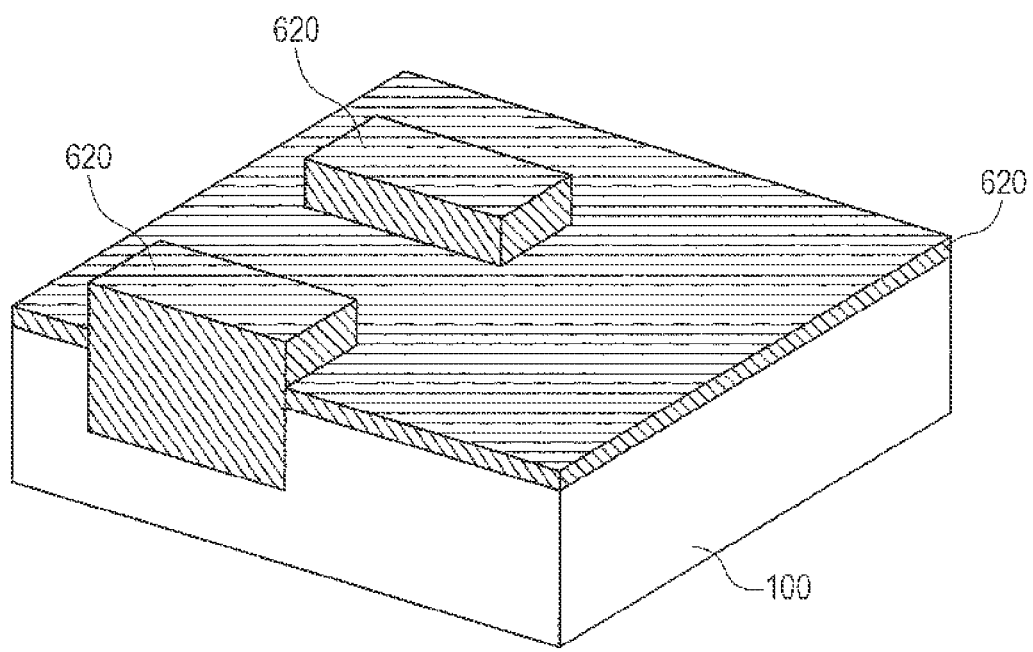
FIG. 8 is a bird's-eye view for explaining the method of manufacturing a semiconductor device according to the first embodiment.

Next, as in FIG. 8, the first mask layer 620 is embedded in the groove part 300 by CVD. At this time, a material embedded in the groove part 300 does not need to be the first mask layer 620. As another example, the material embedded in the groove part 300 should just be a material having etching selectivity with respect to the second mask layer 640, for example. Next, the second mask layer 640 is removed selectively by plasma etching or wet etching.

Figure 9:
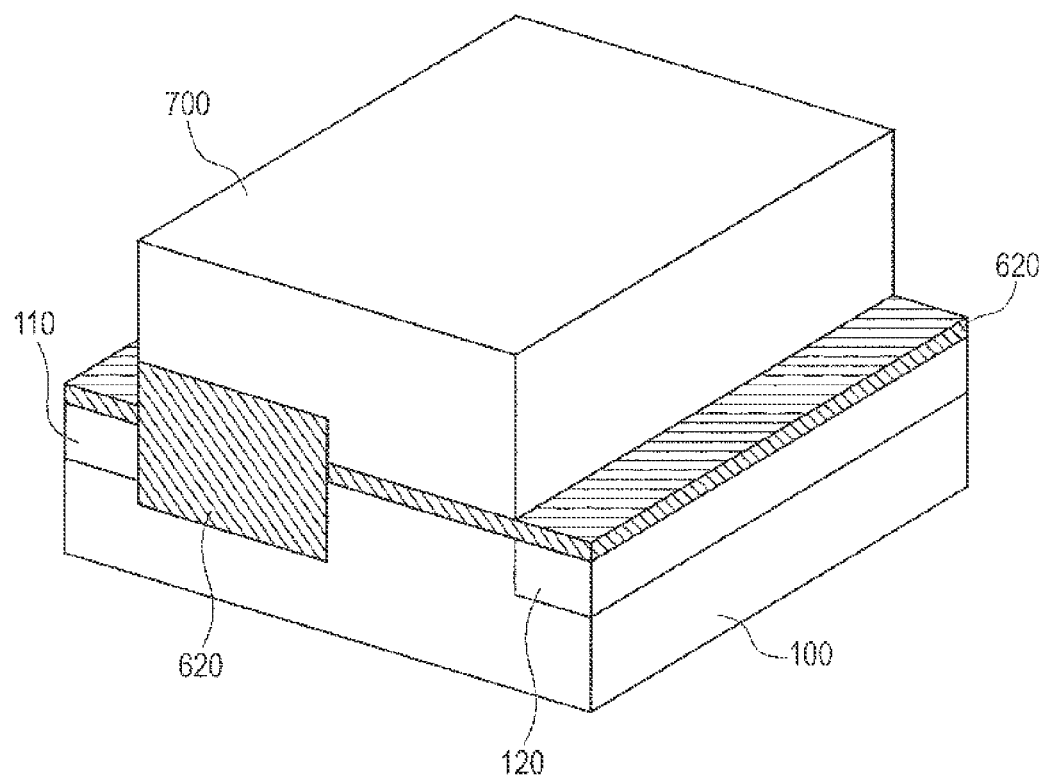
FIG. 9 is a bird's-eye view for explaining the method of manufacturing a semiconductor device according to the first embodiment.

Next, as in FIG. 9, a photoresist layer 700 is again formed over the second mask layer 640. Next, an opening of the photoresist layer 700 (symbol not illustrated) that faces the second plane 32 being one of the side faces of the groove part 300 is formed by exposure and development at a position where at least a part thereof extends in a direction parallel to the nodal line of the first plane 31 and the second plane 32, and at a position separated from the third plane 33 being the other side face of the groove part 300 opposite to the second plane 32 in a plan view. That is, the opening of the photoresist layer 700 is formed in formation regions of the source region 110 and of the drain region 120. Next, Si is implanted into the opening as the n-type impurities. Thereby, the source region 110 that faces the second plane 32 is formed at a position where at least a part thereof extends in a direction parallel to the nodal line of the first plane 31 and the second plane 32. Here, the source region 110 is formed to touch the second plane 32. Moreover, the drain region 120 is formed at a position separated from the third plane 33 being the other side face of the groove part 300 opposite to the second plane 32. At this time, an implantation volume of impurity, an acceleration voltage, etc. are adjusted, for example, so that the source region 110 and the drain region 120 may be formed more shallowly than the groove part 300. Next, the photoresist layer 700 is removed by, for example, asking, etc.

Figure 10:
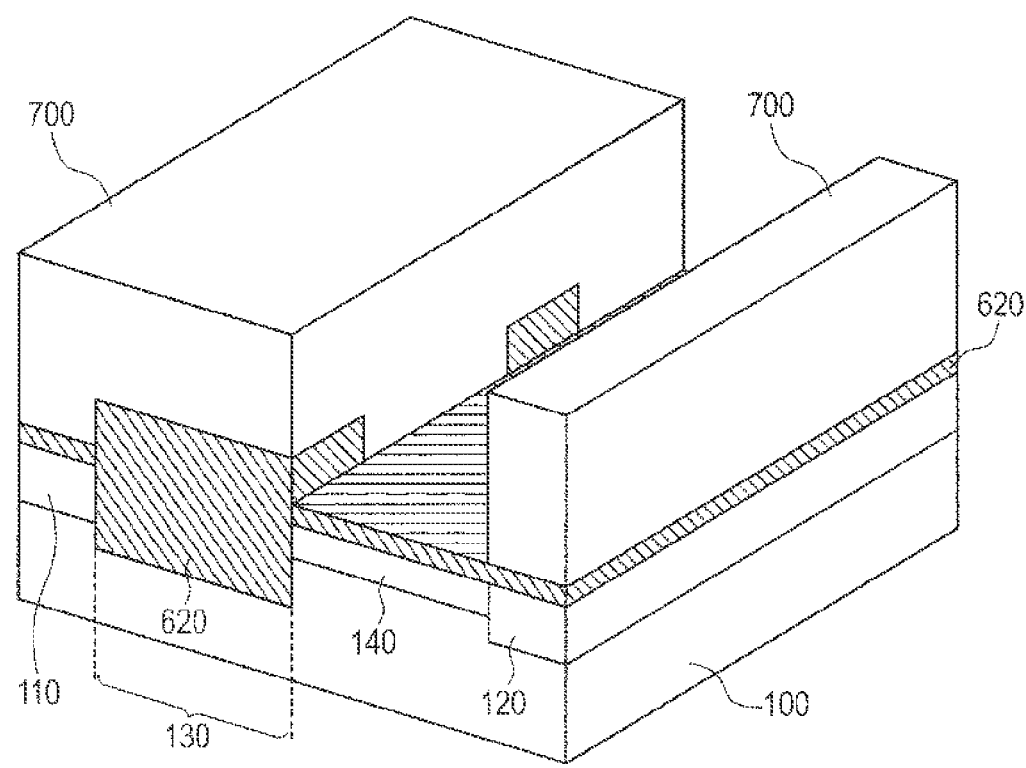
FIG. 10 is a bird's-eye view for explaining the method of manufacturing a semiconductor device according to the first embodiment.

Next, as in FIG. 10, the photoresist layer 700 is again formed over the first mask layer 620. Next, by exposure and development, the opening (symbol not illustrated) of the photoresist layer 700 that touches the drain region 120 and faces the third plane 33 is formed at a position where at least a part thereof extends in a direction parallel to the nodal line of the first plane 31 and the third plane 33. Next, Si is implanted into the opening as the n-type impurities. In a step of forming this drift region 140, an acceleration voltage etc. is adjusted so that the drift region 140 may become shallower than the groove part 300. Moreover, at this time, impurities of the first conductivity type at a lower concentration than the source region 110 and the drain region 120 are implanted into the opening. By this, the drift region 140 that touches the drain region and faces the third plane 33 is formed at a position where at least a part thereof extends in a direction parallel to the nodal line of the first plane 31 and the third plane 33.

By the above steps, the channel region 130 is formed in the region sandwiched by the source region 110 and the drift region 140 in a plan view. The channel region 130 is formed so that the length of the channel region 130 may become not less than 100 nm and less than 10 μm. Moreover, the drift region 140 is formed so that the length in a direction going from the source region 110 toward the drain region 120 in the drift region 140 may become not less than 100 nm and less than 10 μm.

In the above steps, although the case where the source region 110 and the drain region 120 were formed prior to formation of the drift region 140 was explained, the drift region 140 may be formed prior to formation of the source region 110 and the drain region 120.

Next, the photoresist layer 700 is removed by, for example, asking, etc. Furthermore, the first mask layer 620 is removed by plasma etching or wet etching.

Here, the impurities implanted into the source region 110, the drift region 140, and the drain region 120 are activated by, for example, performing the annealing treatment at not lower than 700° C. and lower than 1300° C. By this, implanted ions and crystal constituent atoms can be replaced with each other. Moreover, crystallinity of the semiconductor substrate 100 that has suffered damage by ion implantation can be recovered. Incidentally, the annealing treatment may be performed in a state where the first plane 31 of the semiconductor substrate 100 is covered with the first mask layer 620. Thereby, in the case where the first plane 31 side is the group III nitride semiconductor layer 104, coming out of the nitrogen of the semiconductor substrate 100 can be inhibited.

Figure 11:
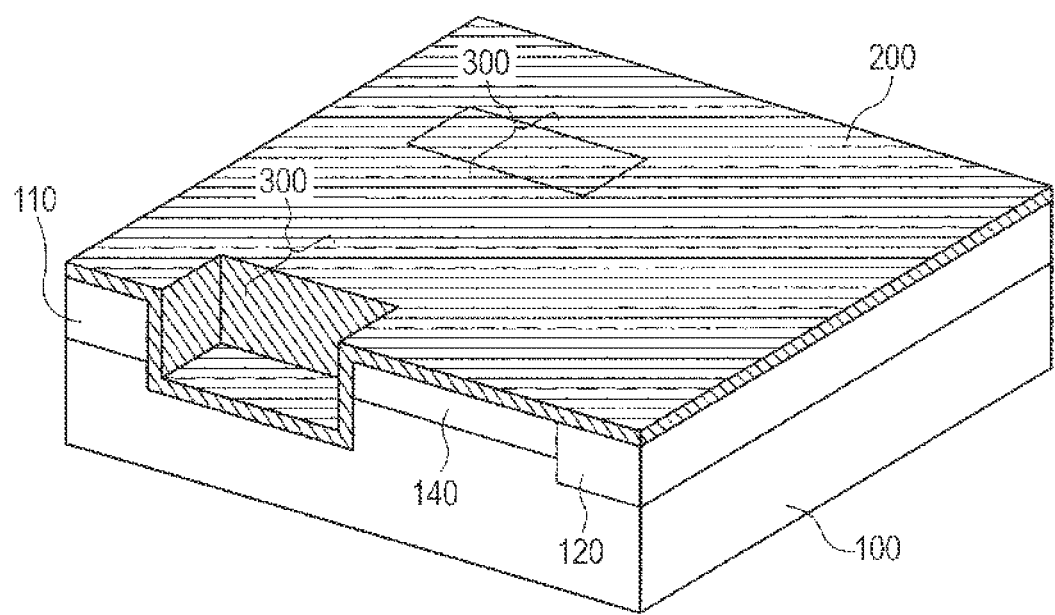
FIG. 11 is a bird's-eye view for explaining the method of manufacturing a semiconductor device according to the first embodiment.

Next, as in FIG. 11, the first gate insulating layer 200 is formed, for example, by sputtering so as to touch at least the fourth plane 34 that is a plane lying in a direction in which the second plane 32 and the third plane 33 intersect among the side faces of the groove part 300 and so as to touch at least the channel region 130 sandwiched by the source region 110 and the drift region 140 in a plan view among regions over the first plane 31. By forming the first gate insulating layer 200 by sputtering, the first gate insulating layer 200 of excellent film quality can be formed. As the first gate insulating layer 200, a film of $SiO_2$, SiN, or $Al_2O_3$ is formed, for example. Thus, the first gate insulating layer 200 is formed so as to touch the fourth plane 34 and so as to touch at least the channel region 130 sandwiched by the source region 110 and the drift region 140 among regions over the first plane 31 in a plan view. Here, the first gate insulating layer 200 is formed to touch the first plane 31, the second plane 32, the third plane 33, and the fourth plane, and the bottom of the groove part 300.

Figure 12:
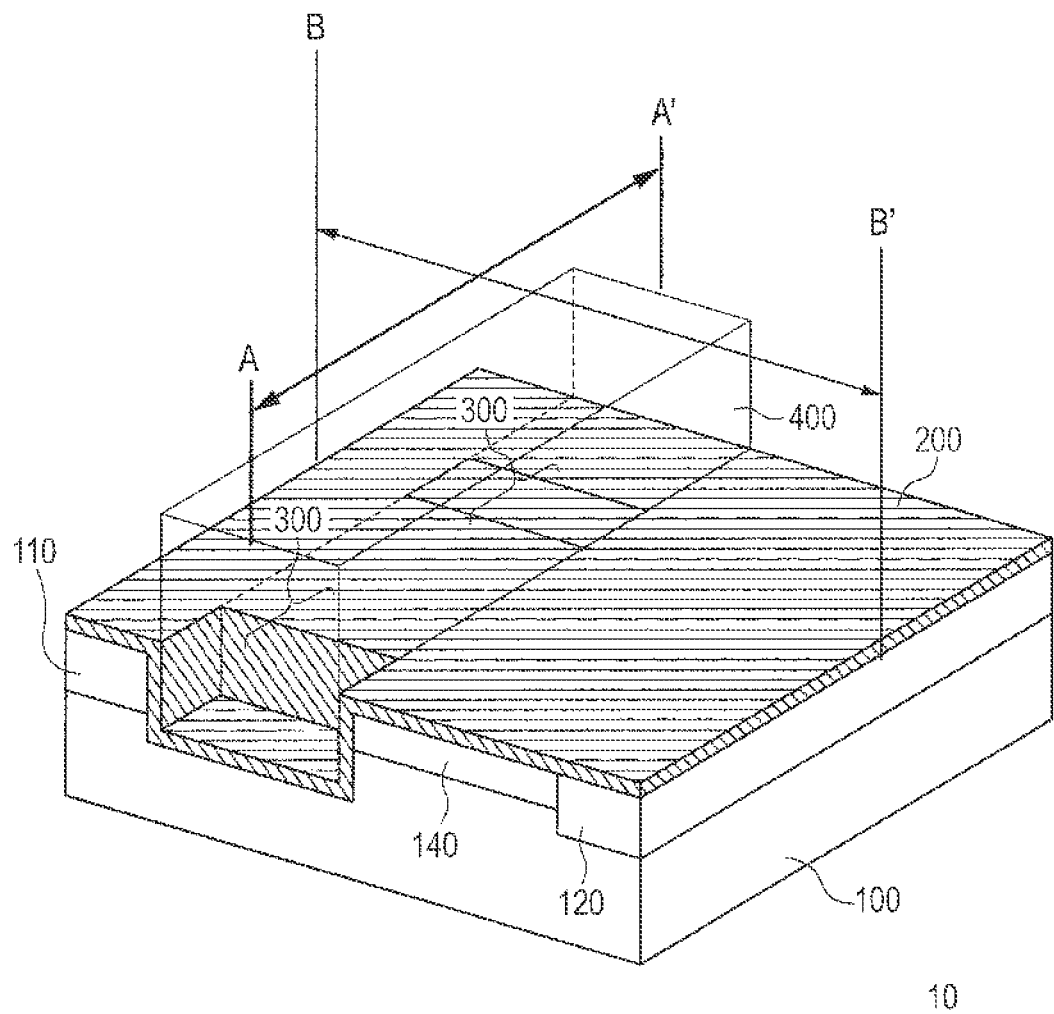
FIG. 12 is a bird's-eye view for explaining the method of manufacturing a semiconductor device according to the first embodiment.

Next, as in FIG. 12, a metallic film is formed over the first gate insulating layer 200 by sputtering. For example, a film of Al and/or TiN is formed as the metallic film. Next, a photoresist layer (unillustrated) is formed over the metallic film. By exposure and development, the photoresist layer is patterned to remain over the fourth plane of the groove part 300 and at a position that overlaps the channel region 130 in a plan view. The metallic film is etched by plasma etching or wet etching by using this photoresist layer 700 as a mask. Next, the photoresist layer is removed by, for example, asking. By the above, the gate electrode 400 is formed over the first gate insulating layer 200.

Next, as in FIG. 4 shown previously, the first interlayer insulating layer 520 is formed over the first gate insulating layer 200 and the gate electrode 400 by, for example, CVD.

As the first interlayer insulating layer 520, a film of $SiO_2$, SiN, SiON, SiOC, SiOCH, SiCOH, or SiOF is formed, for example.

Next, a via hole (unillustrated) of the source electrode 440 is formed at a position that overlaps the source region 110 in a plan view so as to penetrate the first interlayer insulating layer 520 and the first gate insulating layer 200 and so as to touch the first plane 31 of the semiconductor substrate 100 by RIE. Simultaneously, a via hole (unillustrated) of the drain electrode 460 is formed at a position that overlaps the drain region 120 in a plan view so as to penetrate the first interlayer insulating layer 520 and the first gate insulating layer 200 and to touch the first plane 31 of the semiconductor substrate 100 by RIE.

Next, metal is formed over the side faces, the bottom, and the first interlayer insulating layer 520 in the via holes of the source electrode 440 and the drain electrode 460 by, for example, sputtering. This embeds the metal in the interiors of the via holes of the source electrode 440 and the drain electrode 460. Specifically, a film of Al and/or TiN, etc. is formed by sputtering. Next, a top of the first interlayer insulating layer 520 is flattened by CMP (Chemical Mechanical Polishing). By this, the via of the source electrode 440 and the via of the drain electrode 460 are formed.

Then, a multilayer interconnection structure (unillustrated) may be formed over the first interlayer insulating layer 520 by a damascene method. Moreover, an electrode pad (unillustrated) may be formed over a top layer of the multilayer interconnection structure.

By the above, the semiconductor device 10 according to the first embodiment can be obtained.

Next, an effect of the first embodiment will be explained using FIG. 13 to FIG. 15. FIG. 13 to FIG. 15 are drawings for explaining the effect of the first embodiment.

Here, let the semiconductor device 10 in which the groove part 300 is not formed be considered as a comparative example. In the semiconductor device 10 of the comparative example, it is assumed that other configurations are the same as those of the first embodiment.

Figure 13A:
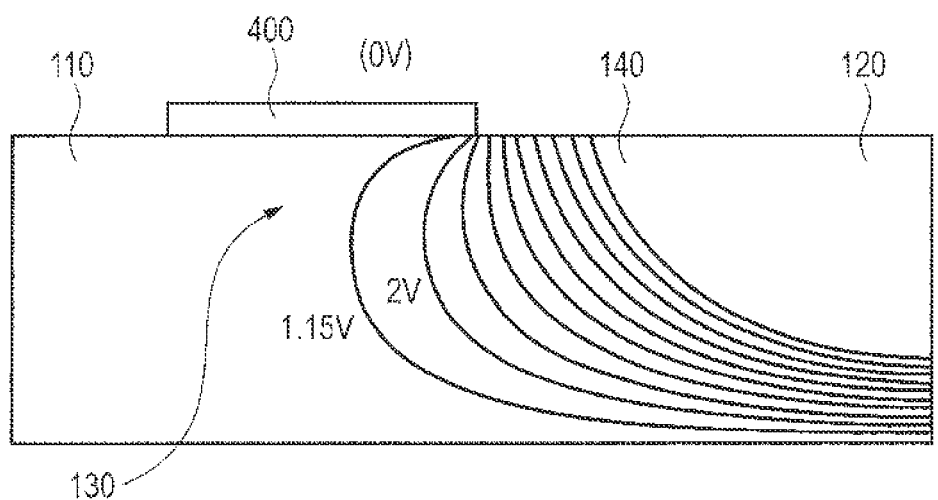
Figure 13B:
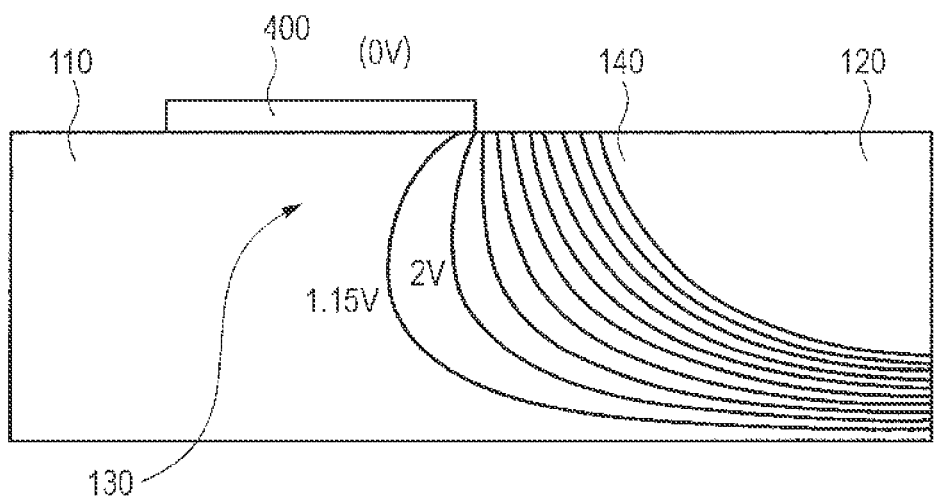

FIG. 13 shows a result of simulation of potential contour lines in the neighborhood of a boundary of the drift region 140 and the channel region 130. Incidentally, FIG. 13 is a diagram of the groove part 300 seen from a normal direction of the fourth plane 34 thereof. FIG. 13A shows a case of the comparative example; FIG. 13B shows a case of the first embodiment. In any case, the gate electrode 400 and the source electrode 440 are set to 0 V, and the drain electrode 460 is set to 100 V. That is, these diagrams show a time when the gate is OFF.

As in FIG. 13, in either case, the potential contour lines have spread toward the drift region 140 from the drain region 120 side that is at a high voltage as far as the channel region 130 placed directly under the gate electrode 400 while being gently alleviated.

In the case of the comparative example of FIG. 13A, the potential near the gate electrode 400 in the neighborhood of the boundary of the drift region 140 and the channel region 130 is 2 to 3 V. Thus, in the comparative example, when the gate is OFF, the electric field tends to concentrate near the gate electrode 400 in the neighborhood of the boundary of the drift region 140 and the channel region 130. For this reason, there is a possibility that the electric field may concentrate on that portion and the semiconductor device 10 may cause dielectric breakdown.

On the other hand, in the case of the first embodiment of FIG. 13B, the potential contour lines that go from the drift region 140 toward the source region 110 in the channel region 130 become hard to spread. The potential near the gate electrode 400 in the neighborhood of the boundary of the drift region 140 and the channel region 130 is 1 to 2 V. That is, the potential of the region in the case of the first embodiment is smaller than that in the case of the comparative example. By the groove part 300 being formed like the first embodiment, the potential by the gate electrode 400 is formed down to a portion deeper than the drift region in the groove part. By the potential by this gate electrode 400, it is possible to inhibit the electric field between the source region 110 and the drain region 120 from going round from the drift region 140 to the channel region 130. Therefore, it is possible to alleviate concentration of the electric field near the gate electrode 400 in the neighborhood of the boundary of the drift region 140 and the channel region 130.

Figure 14A:
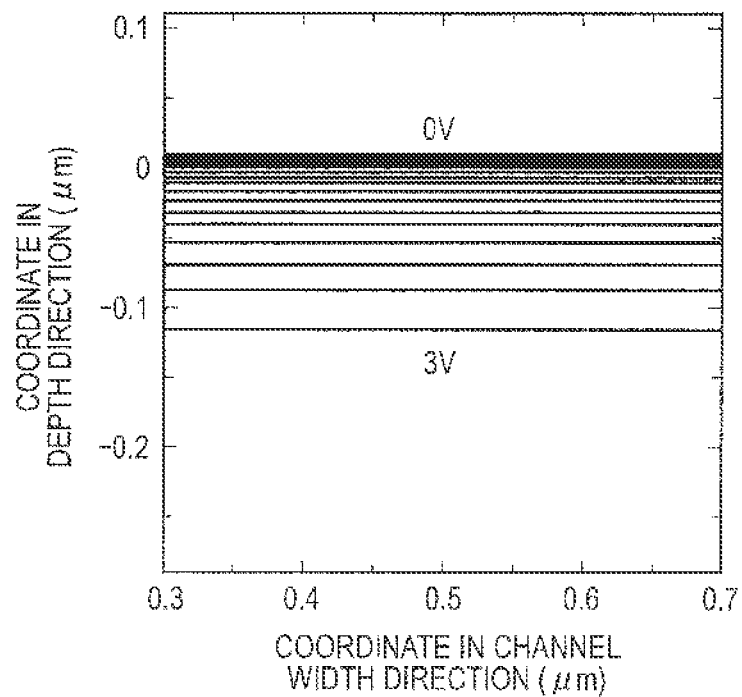
Figure 14B:
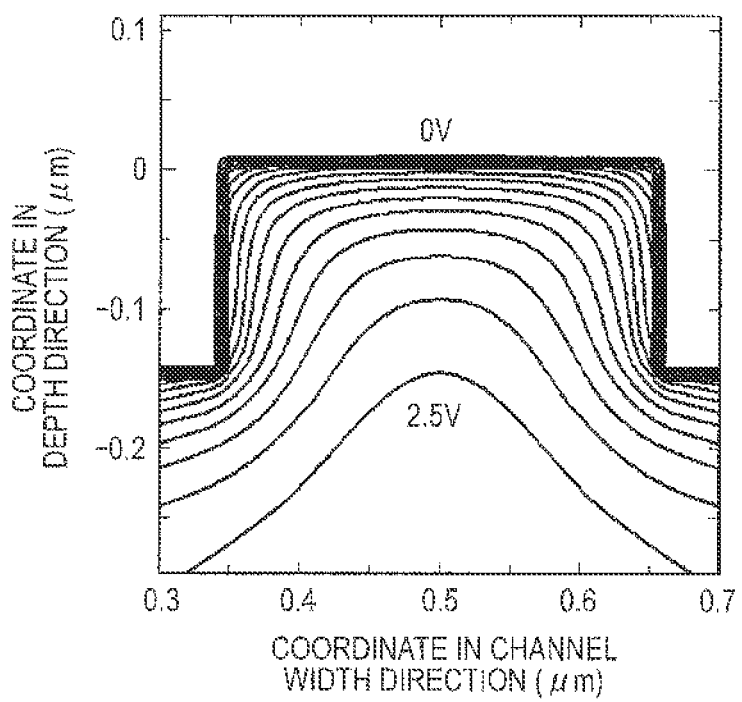
Figure 15:
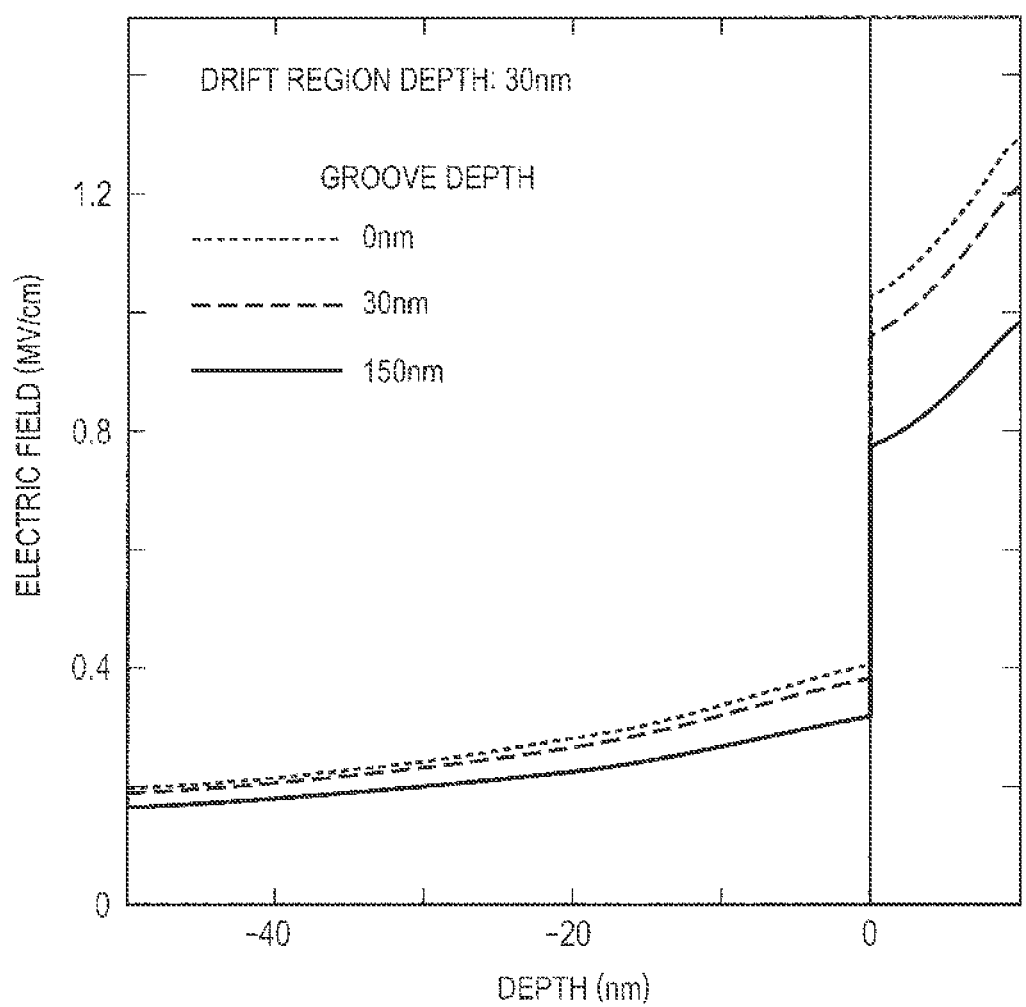
FIG. 15 is a diagram for explaining the effect of the first embodiment.

FIG. 14 shows a result of simulating the potential contour lines in the cross section of the boundary of the drift region 140 and the channel region 130. Incidentally, FIG. 14 is a diagram seen from a normal direction of the third plane 33 of the groove part 300. A horizontal axis in FIG. 14 shows a coordinate in the channel width direction. On the other hand, a vertical axis in FIG. 14 shows a coordinate in the depth direction with the depth of the first plane 31 being set to zero. FIG. 14A is the case of the comparative example; FIG. 14B shows the case of the first embodiment. In both cases, the gate electrode 400 and the source electrode 440 are set to 0 V, and the drain electrode 460 is set to 100 V.

In the case of the comparative example of FIG. 14A, the potential contour lines are distributed in parallel to the first plane 31. Moreover, the potential contour lines especially near the first plane 31 become dense. The potential near a depth of −0.15 μm is more than or equal to 3 V. Thus, the larger the potential difference between the potential of a region directly under the gate electrode 400 and the potential of the gate electrode 400 (here 0 V), the more intense the electric field concentration in the neighborhood of a boundary surface of the first gate insulating layer 200 becomes. Therefore, there is a possibility in the comparative example that the above-mentioned breakdown may occur.

On the other hand, in the case of the first embodiment of FIG. 14B, the potential contour lines are gently distributed according to the shape of the groove part 300. Moreover, the potential near a depth of −0.15 μm is less than or equal to 2.5 V at a maximum. That is, the potential of the region in the case of the first embodiment is smaller than that in the case of the comparative example. Moreover, in the first embodiment, the potential contour lines near the first plane 31 are sparser than those in the comparative example. By the groove part 300 being formed like the first embodiment, it is possible to alleviate concentration of the electric field between the source region 110 and the drain region 120 near the first gate insulating layer 200 (near the first plane 31). Furthermore, by the multiple groove parts being provided, an effect of alleviating the electric field between the source region 110 and the drain region 120 can be enhanced.

FIG. 15 shows a result of simulating the magnitude of the electric field in the boundary of the drift region 140 and the channel region 130 when the depth of the drift region 140 is set to be 30 nm. The horizontal axis in FIG. 15 shows a coordinate of in the depth direction with the depth of the first plane 31 set to zero. On the other hand, the vertical axis in FIG. 15 shows the magnitude of the electric field.

As in FIG. 15, as the depth of the groove part 300 becomes deeper than the drift region 140, the electric field tends to be alleviated more. When the depth of the groove part 300 is shallower than the drift region 140, the electric field that goes from the drift region 140 toward the source region 110 will extend to the channel region 130 side, going round the under side of the groove part 300. On the other hand, when the depth of the groove part 300 is deeper than the drift region 140, the potential by the gate electrode 400 can inhibit the electric field between the source region 110 and the drain region 120 from going round from the drift region 140 to the channel region 130.

As described above, according to the first embodiment, the groove part 300 is formed more deeply than the drift region 140. The gate electrode 400 is formed to overlap the channel region 130 in a plan view among regions over the fourth plane 34 of the groove part 300 and the first plane 31 of the semiconductor substrate 100 through the first gate insulating layer 200. Thereby, a potential by the gate electrode 400 is formed down to a portion deeper than the drift region 140 in the groove part 300. This potential can inhibit the electric field between the source region 110 and the drain region 120 from going round from the drift region 140 to the channel region 130.

Furthermore, according to the first embodiment, the semiconductor device 10 can be made to have a high breakdown voltage by forming only the impurity region of the first conductivity type. Here, if the semiconductor layer for forming the impurity region can control the conductivity of both the n-type and the p-type, there will be the case where under the source region 110 or the drain region 120, a halo region (or called a pocket region) of a conductivity type reverse to that of these and the like will be formed. In this case, provision of the halo region makes it possible to inhibit punch through between the drain and the source. Therefore, it becomes possible to alleviate the electric field in the semiconductor device 10 by forming the impurity region of the conductivity type reverse to that of these. However, in the case of a semiconductor material whose electric conduction is hard to control, there is a possibility that providing the impurity region of the conductivity type reverse to that of the source region 110 or the drain region 120 is difficult. Then, even with a semiconductor material whose electric conduction control is difficult, the semiconductor device 10 can be made to have a high breakdown voltage stably by forming a configuration like that of the first embodiment only with the impurity region of the first conductivity type. For example, this method is especially effective in the case where the semiconductor substrate 100 contains the group III nitride semiconductor layer 104 whose electric conduction control is difficult, as described above.

Therefore, according to the first embodiment, it is possible to provide the semiconductor device 10 whose breakdown voltage is improved high by controlling so that the electric field may not concentrate locally.

Second Embodiment

Figure 16:
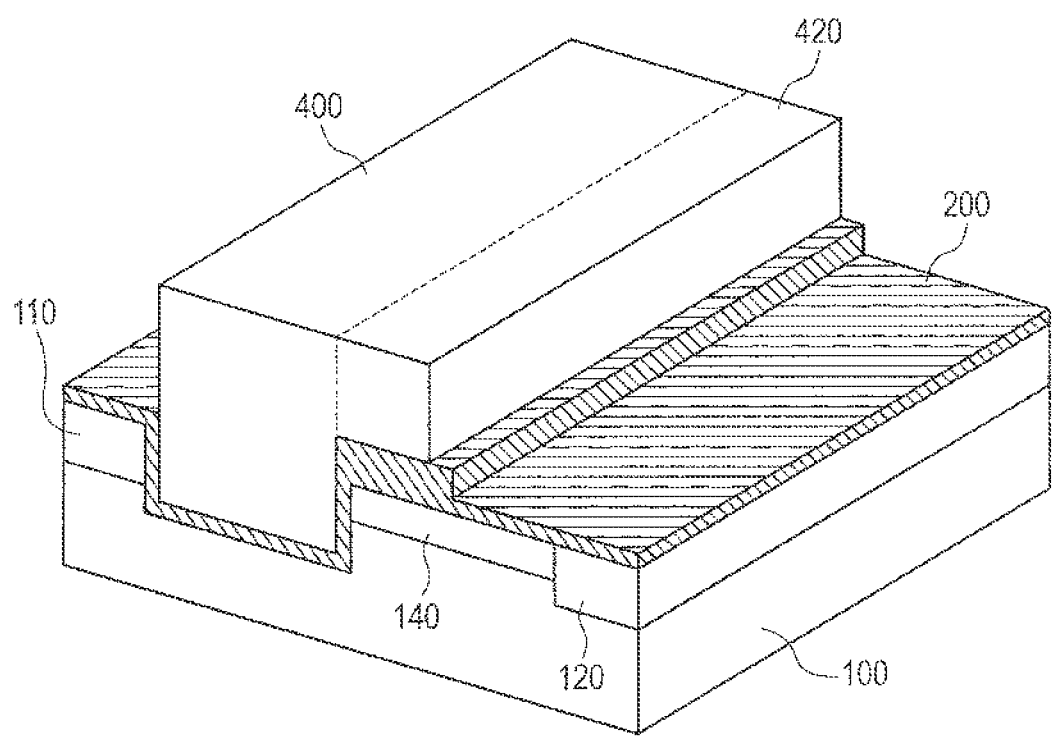
FIG. 16 is a bird's-eye view showing a configuration of a semiconductor device according to a second embodiment.

FIG. 16 is a bird's-eye view showing a configuration of the semiconductor device 10 according to a second embodiment. The second embodiment is the same as the first embodiment except for a point that a field plate electrode 420 is formed. Below, details will be explained.

As in FIG. 16, the field plate electrode 420 is provided so that it may overlap a part of the drift region 140 in a plan view. The field plate electrode 420 is provided so that it may overlap the drift region 140 from the channel region 130 side to a central part of the drift region 140 in a plan view.

A voltage within a voltage between the gate electrode 400 and the drain electrode 460 is applied to the field plate electrode 420.

Moreover, the field plate electrode 420 touches the gate electrode 400, for example. Specifically, the field plate electrode 420 is formed as one piece with, for example, the gate electrode 400. Incidentally, the field plate electrode 420 may be formed separated from the gate electrode 400. For example, the field plate electrode 420 may be formed in contact with the source electrode 440. In this case, a voltage different from that of the gate electrode 400 may be applied to the field plate electrode 420.

The field plate electrode 420 is separated from the first plane 31 by an amount larger than a separation between the gate electrode 400 and the channel region 130. Here, the thickness of a portion of the field plate electrode 420 that overlaps the drift region 140 in the first gate insulating layer 200 in a plan view is thicker than a portion thereof that overlaps the channel region 130 in a plan view. Alternatively, an insulating layer of a different material may be provided in a portion where the field plate electrode 420 overlaps the drift region 140 in a plan view over the first gate insulating layer 200.

A method of manufacturing the semiconductor device 10 of FIG. 16 has the following steps, for example.

The same steps shown by up to FIG. 11 as those of the first embodiment are performed. Next, in FIG. 11, the first gate insulating layer 200 is formed to be thicker than a portion of the first gate insulating layer 200 that overlaps the channel region 130 in a plan view. At this time, the first gate insulating layer 200 is formed to be as thick as a portion in which the field plate electrode 420 is formed in a plan view. A photoresist layer is formed over the first gate insulating layer 200. Next, patterning is performed by exposure and development so that the photoresist layer may remain at least in a region where the field plate electrode 420 overlaps the drift region 140 in a plan view. Next, the first gate insulating layer 200 is etched to a desired thickness by wet etching or plasma etching. Next, the photoresist layer is removed by, for example, asking, etc.

Next, the field plate electrode 420 is formed as one piece with the gate electrode 400 by, for example, sputtering. At this time, the field plate electrode 420 is formed to overlap a part of the drift region 140 in a plan view. The steps after this are the same as those of the first embodiment.

According to the second embodiment, the field plate electrode 420 is formed to overlap a part of the drift region 140 in a plan view. In the second embodiment, the same effect as that of the first embodiment can be achieved. Furthermore, according to the second embodiment, an effect equivalent to that of the case where the impurity region having a lower concentration than the drift region 140 is formed in a portion that overlaps the field plate electrode 420 in the drift region 140 in a plan view can be achieved. Thereby, the electric field between the channel region 130 and the drain region 120 can be alleviated stepwise. Therefore, it is possible to provide a semiconductor device 10 whose breakdown voltage is further raised.

Third Embodiment

Figure 17:
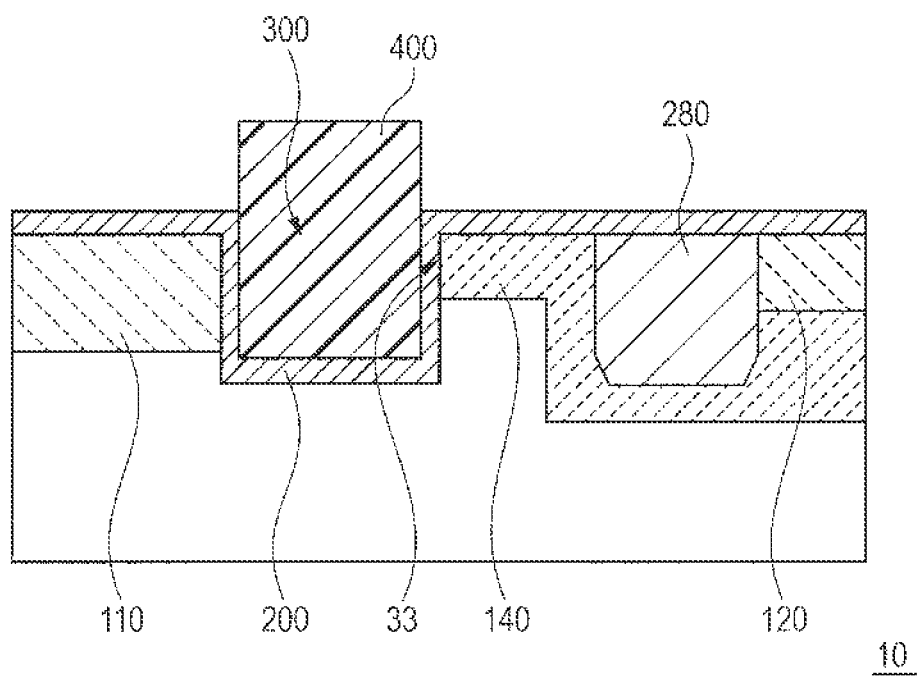
FIG. 17 is a sectional view showing a configuration of a semiconductor device according to a third embodiment.

FIG. 17 is a sectional view showing a configuration of the semiconductor device 10 according to a third embodiment. Moreover, the sectional view corresponds to a sectional view seen from an arrow side of a B-B' line of FIG. 1. The third embodiment is the same as the first embodiment except for the following points. It further has the element isolation region 280 that is provided on the first plane 31 side of the semiconductor substrate 100, is provided to overlap the drift region 140 in a plan view, and is provided separated from the third plane 33. The drift region 140 touches a side face on the third plane 33 side and the bottom of the element isolation region 280. Below, details will be explained.

As in FIG. 17, the element isolation region 280 is provided on the first plane 31 side of the semiconductor substrate 100. The element isolation region 280 is formed to overlap the drift region 140 in a plan view. Moreover, the element isolation region 280 is provided separated from the third plane 33 of the groove part 300. The element isolation region 280 is provided, for example, aligning in parallel to the channel region 130 in a plan view. The element isolation region 280 is continuously formed to the region where the groove part 300 is not formed in a plan view.

The element isolation region 280 is the STI (Shallow Trench Isolation), for example. Specifically, the element isolation region 280 is of $SiO_2$, for example. In the case where the semiconductor substrate 100 is Si, the element isolation region 280 may be LOCOS (Local Oxidation of Silicon), for example.

In addition to this, the element isolation region 280 is provided in order to partition the multiple element regions. The element isolation region 280 may be formed in a region other than the region where it overlaps the drift region 140 in a plan view.

The depth of the groove part 300 is equal to that of the element isolation region 280. Thereby, the groove part 300 and the element isolation region 280 can be formed simultaneously. That is, the manufacturing process can be simplified.

The depth of a portion of the drift region 140 that touches (or faces) the third plane 33 of the groove part 300 is shallower than the groove part 300. By this, the groove part 300 can inhibit the electric field from going round from the drift region to the channel region and extending there.

A distance between the element isolation region 280 and the groove part 300 is not less than 50 nm and less than 5 μm, for example. By a fact that the distance between the element isolation region 280 and the groove part 300 is within the above-mentioned range, it is possible to inhibit the electric field from extending in the channel region 130 going round from the drift region 140 to there after going round the underside of the groove part 300.

The drift region 140 touches the side face on the third plane 33 side and the bottom in the element isolation region 280. The drift region 140 touches the drain region 120 at a farther position separated from the groove part 300 than the element isolation region 280 does. Moreover, the drift region 140 touches the underside of the drain region 120, for example.

Next, a method of manufacturing the semiconductor device 10 according to the third embodiment will be explained using FIG. 18 to FIG. 20. FIG. 18 to FIG. 20 are sectional views for explaining the method of manufacturing the semiconductor device 10 according to the first embodiment. The method of manufacturing the semiconductor device 10 according to the third embodiment is the same as that of the first embodiment except for a point that the element isolation region 280 is formed. Below, details will be explained.

Figure 18A:
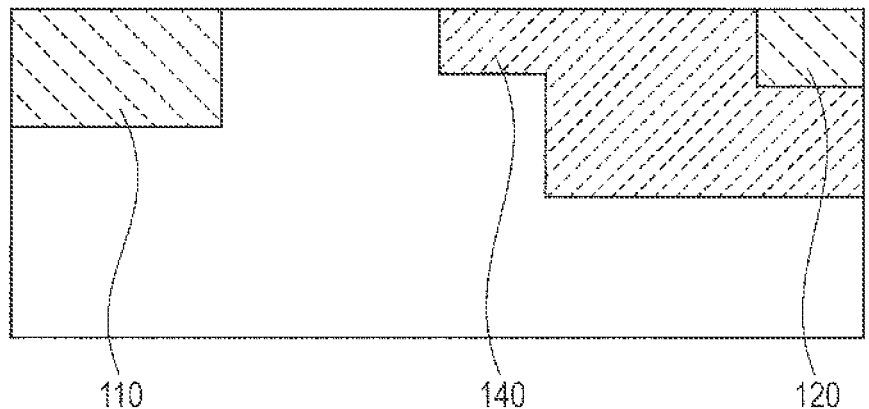

As in FIG. 18A, the source region 110, the drift region 140, and the drain region 120 are formed over the first plane 31 side of the semiconductor substrate 100 by the ion implantation. The drift region 140 among these regions may be formed by performing the ion implantation twice. Next, the impurities implanted into the source region 110, the drift region 140, and the drain region 120 are activated by performing annealing treatment.

Figure 18B:
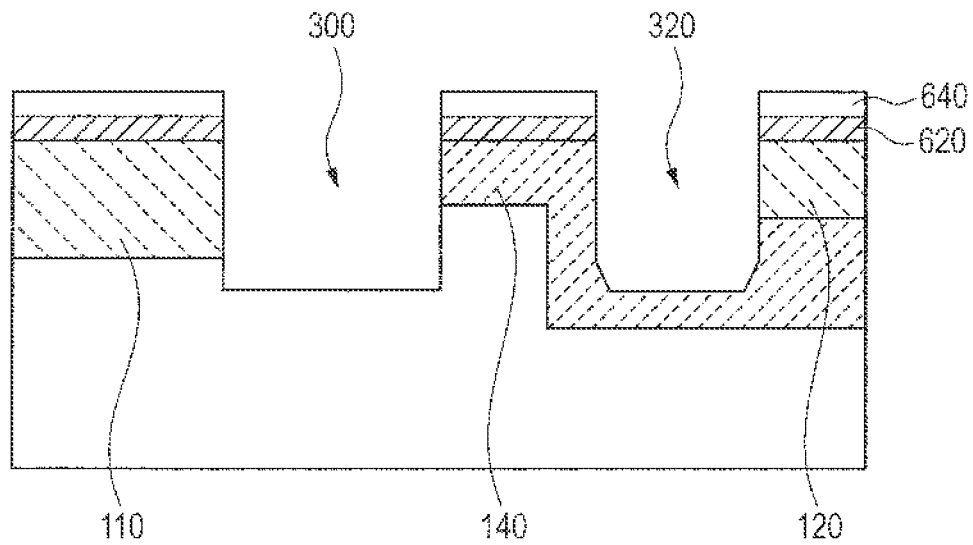

As in FIG. 18B, the first mask layer 620 and the second mask layer 640 are formed. Next, a photoresist layer is patterned. Next, the first mask layer 620, the second mask layer 640, and the first plane 31 of the semiconductor substrate 100 are etched by RIE. By this, the groove part 300 and an opening 320 for forming the element isolation region 280 are formed over the first plane 31 side of the semiconductor substrate 100. At this time, the opening 320 is formed so that the depth of the element isolation region 280 may become equal to that of the groove part 300.

Figure 19A:
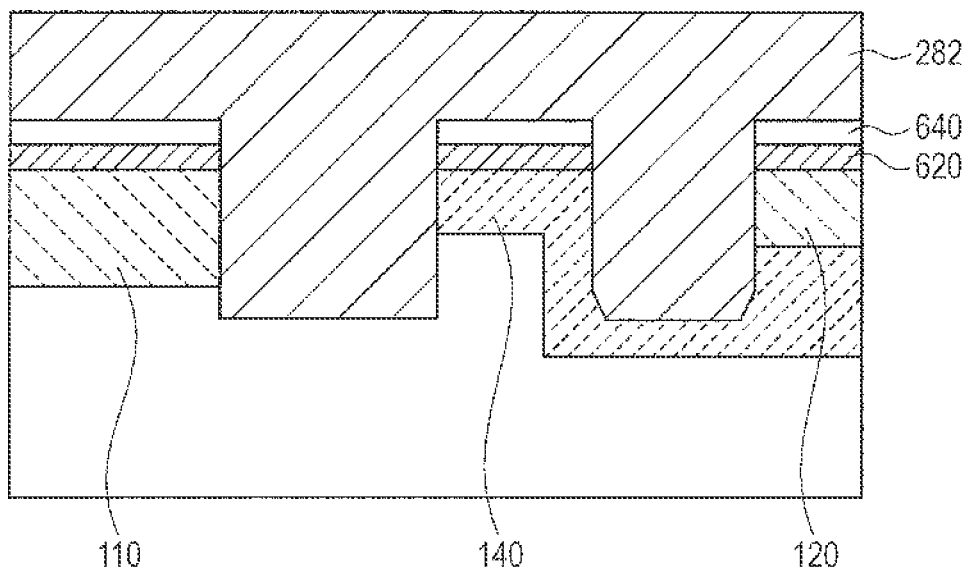

As in FIG. 19A, an insulating layer 282 is embedded at least in the opening 320 by CVD. The insulating layer 282 is $SiO_2$, for example. Here, the insulating layer 282 is embedded in the opening 320 and the groove part 300, for example.

Figure 19B:
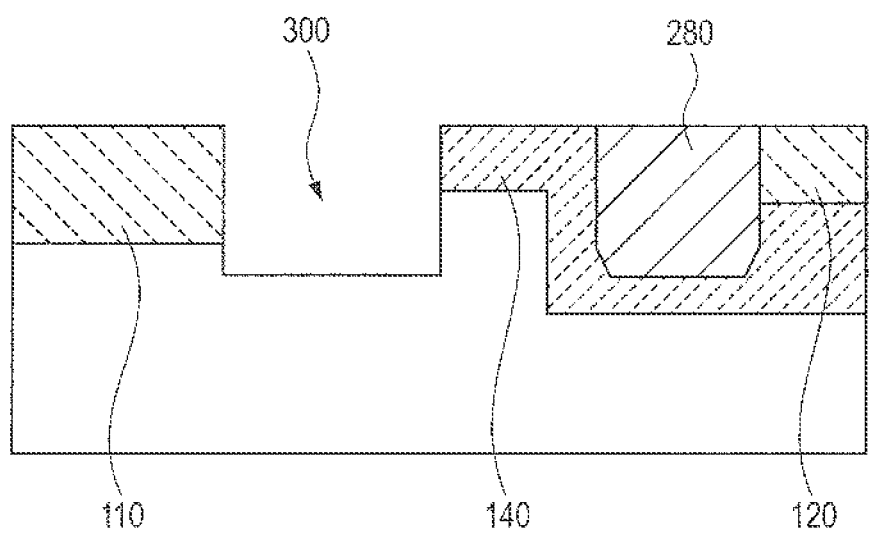

As in FIG. 19B, the top of the first plane 31 of the semiconductor substrate 100 is flattened by CMP until a top face of the second mask layer 640 is exposed. Next, the second mask layer 640 is removed. Next, a photoresist layer (unillustrated) is formed over the first mask layer 620. Next, the photoresist layer is patterned so that a region overlapping the element isolation region 280 in a plan view may remain. Next, the first mask layer 620 that is exposed in an opening of the photoresist layer and the insulating layer 282 are etched. Next, the photoresist layer is removed by asking etc. Thus, the element isolation region 280 is formed.

Incidentally, the step of forming the groove part 300 and the element isolation region 280 may be divided and done separately. Moreover, the step of forming the groove part 300 and the element isolation region 280 may be done prior to the above-mentioned step of forming the impurity region.

Figure 20A:
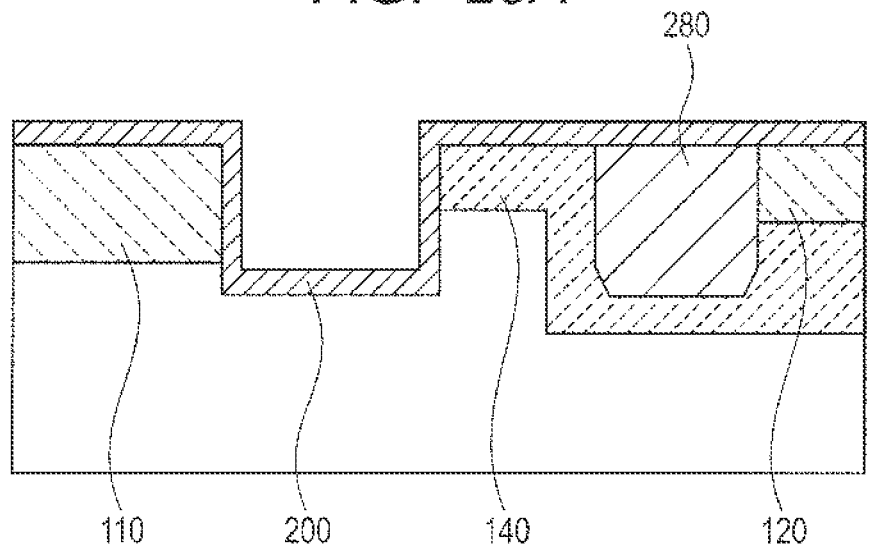

Next, as in FIG. 20A, the first gate insulating layer 200 is formed over the first plane 31 side of the semiconductor substrate 100. At this time, the first gate insulating layer 200 may be formed over the element isolation region 280.

Figure 20B:
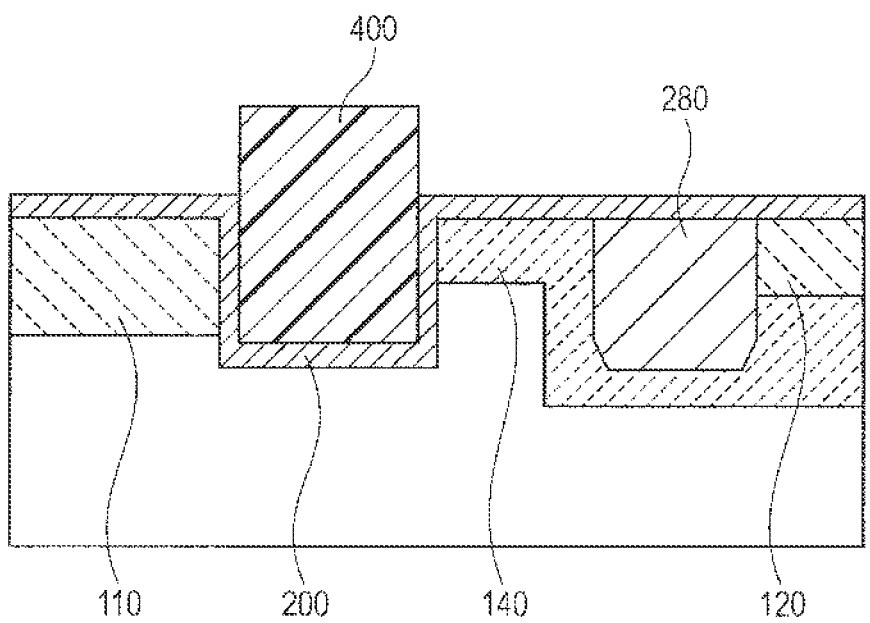

Next, as in FIG. 20B, a metallic film is formed over the first gate insulating layer 200. Next, the gate electrode 400 is formed by patterning the metallic film. The following steps are the same as those of the first embodiment.

According to the third embodiment, the same effect as that of the first embodiment can be achieved. Furthermore, according to the third embodiment, the element isolation region 280 is formed to overlap the drift region 140 in a plan view. As compared with the case where the element isolation region 280 is not formed, an effective distance from the drain region 120 to the channel region 130 is long. Thereby, in an arrangement where the distance between the source region 110 and the drain region 120 in a plan view is short, the high breakdown voltage semiconductor device 10 can be achieved. That is, the semiconductor device 10 whose area in a plan view is small and whose breakdown voltage is high can be obtained.

Although in the third embodiment, the case where the element isolation region 280 was made by the STI was explained, in the case where the semiconductor substrate 100 is Si as described above, it may be made by a LOCOS method. In this case, the element isolation region 280 is formed as follows. First, in the above-mentioned step of forming the element isolation region 280, a mask layer (for example, SiN) is formed except a region where the element isolation region 280 is formed in a plan view. Next, thermal oxidation is performed. This forms the element isolation region 280. Next, the mask layer is removed. Other steps are the same as those of the above-mentioned process.

Fourth Embodiment

Figure 21:
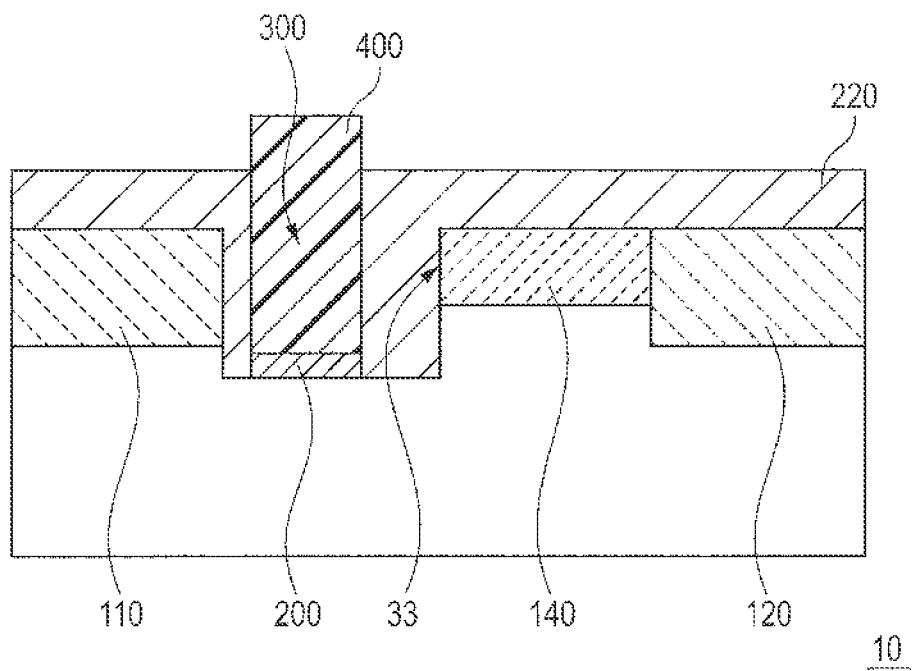
FIG. 21 is a sectional view showing a configuration of a semiconductor device according to a fourth embodiment.

FIG. 21 is a sectional view showing a configuration of the semiconductor device 10 according to a fourth embodiment. The fourth embodiment is the same as the first embodiment or a part of the third embodiment except for a point that the gate electrode 400 is provided separated from the third plane 33 of the groove part 300.

As in FIG. 21, the source region 110, the channel region 130, the drift region 140, and the drain region 120 are formed similarly with the first embodiment.

The first gate insulating layer 200 is provided separated from the drift region 140 in a plan view, for example. The gate electrode 400 is formed over the first gate insulating layer 200.

The gate electrode 400 is provided separated from the third plane 33 of the groove part 300. Moreover, the gate electrode 400 is provided separated from the drift region 140 in a plan view.

A second gate insulating layer 220 is provided over the first plane 31 of the semiconductor substrate 100 and in a part of the groove part 300. The second gate insulating layer 220 touches the third plane 33 of the groove part 300. An opening (symbol not illustrated) is provided at a position separated from the third plane 33 of the groove part 300 in a plan view in the second gate insulating layer 220. The gate electrode 400 and the first gate insulating layer 200 are formed in the opening. Here, at least a portion of the second gate insulating layer 220 that touches the third plane 33 touches the gate electrode 400. Thereby, the gate electrode 400 is separated from the drift region 140 in a plan view.

The second gate insulating layer 220 is formed with, for example, a material different from that of the first gate insulating layer 200. Specifically, the second gate insulating layer 220 is of SiN, for example. Alternatively, the second gate insulating layer 220 may be formed with the same material as that of the first gate insulating layer 200. In this case, the first gate insulating layer 200 may be provided to overlap the second gate insulating layer 220 in a plan view.

The film thickness of a portion of the second gate insulating layer 220 that touches at least the third plane 33 is thicker than the first gate insulating layer 200, for example. Thereby, it is possible to easily form the gate region 400 separated from the drift region 140 in a plan view.

Next, a method of manufacturing a semiconductor device 10 according to the fourth embodiment will be explained using FIG. 22 and FIG. 23. FIG. 22 and FIG. 23 are sectional views for explaining the method of manufacturing a semiconductor device 10 according to the fourth embodiment. The method of manufacturing a semiconductor device according to the fourth embodiment is the same as that of the first embodiment except for a point that the gate electrode 400 is formed separated from the third plane 33 of the groove part 300. Below, details will be explained.

Figure 22A:
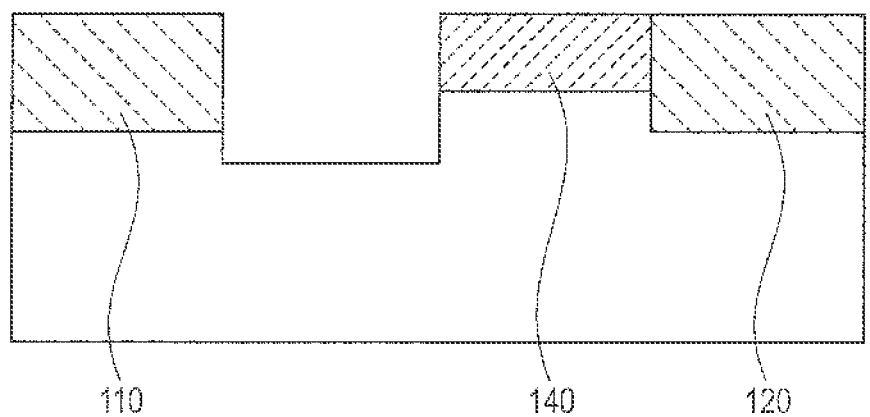

As in FIG. 22A, steps up to FIG. 10 are performed similarly with the first embodiment.

Figure 22B:
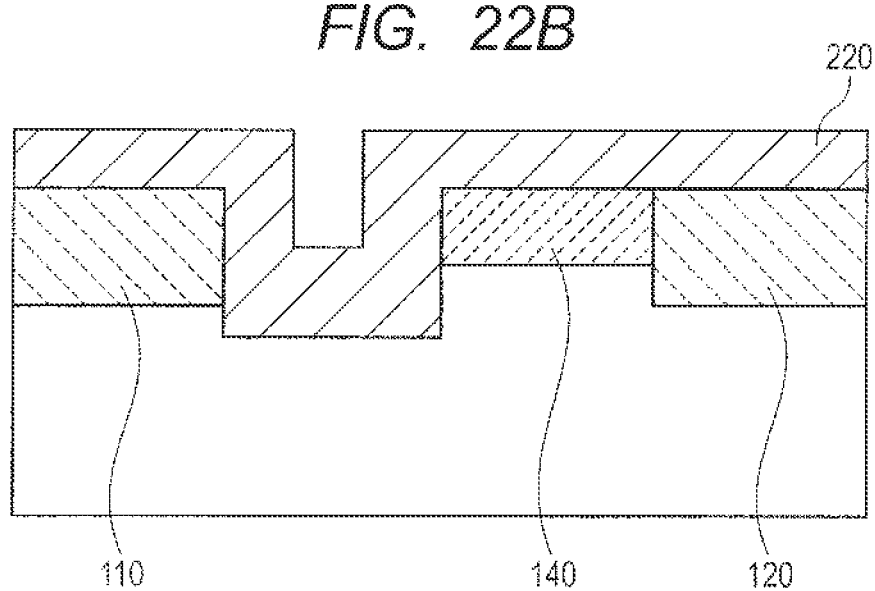

Next, as in FIG. 22B, the second gate insulating layer 220 is formed over the first plane 31 of the semiconductor substrate 100 and in the interior of the groove part 300 by CVD. Here, the second gate insulating layer 220 is formed more thickly than the first gate insulating layer 200, for example.

Figure 23A:
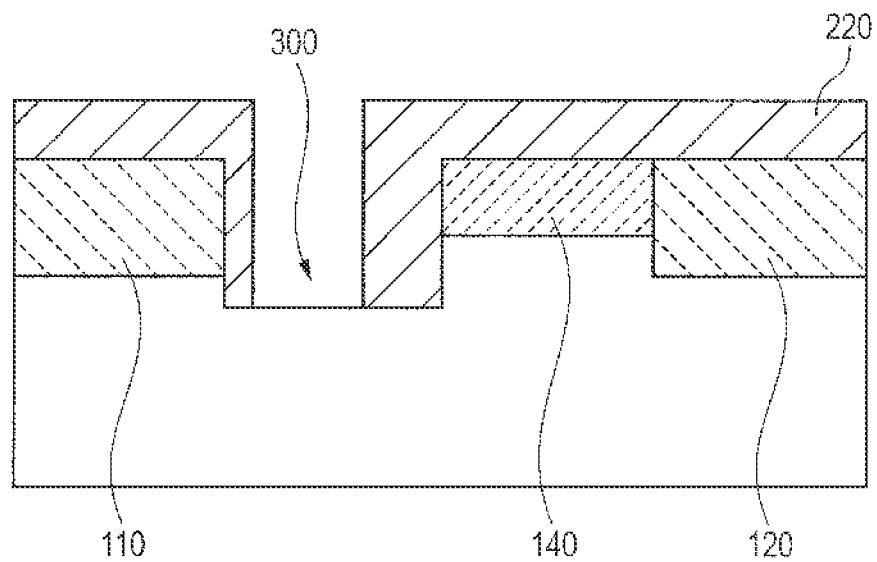

As in FIG. 23A, the opening 320 is formed at a position in the second gate insulating layer 220 that is separated from the third plane 33 of the groove part 300 in a plan view by plasma etching or wet etching.

Figure 23B:
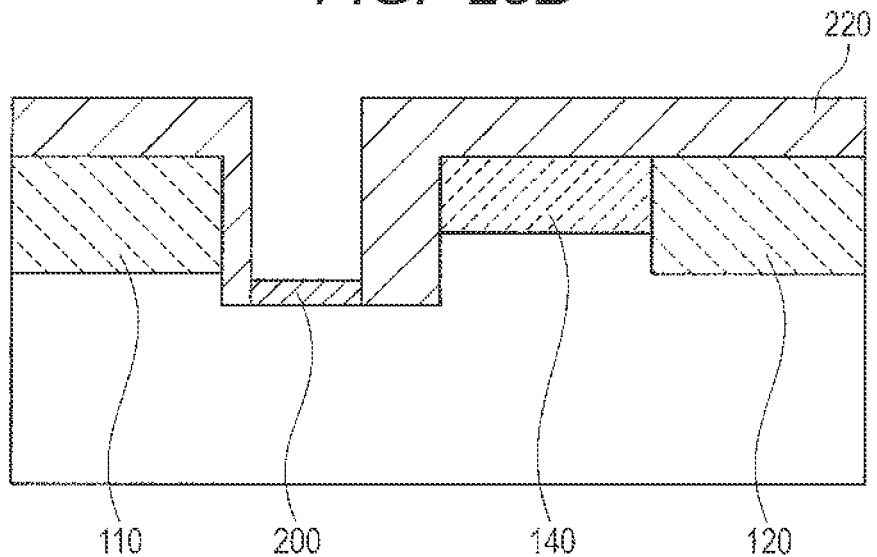

Next, as in FIG. 23B, the first gate insulating layer 200 is formed at least in the interior of the opening 320. Here, the first gate insulating layer 200 is formed to cover a top of the second gate insulating layer 220 and the interior of the opening 320. Next, the first gate insulating layer 200 other than the channel region 130 is removed. Incidentally, the first gate insulating layer 200 may remain formed over the second gate insulating layer 220.

Next, as in FIG. 21, a metallic film is formed over the first gate insulating layer 200 and over the second gate insulating layer 220. Next, the metallic film is patterned and the gate electrode 400 is formed at a position that overlaps the channel region 130 in a plan view. At this time, the gate electrode 400 is formed to be separated from the third plane 33 of the groove part 300 in a plan view. The following steps are the same as those of the first embodiment.

According to the fourth embodiment, the same effect as that of the first embodiment can be achieved. Furthermore, according to the fourth embodiment, the gate electrode 400 is provided separated from the third plane 33 of the groove part 300. As described above, the electric field tends to concentrate between the gate electrode 400 and the drift region 140. Thereby, by the gate electrode 400 being separated from the third plane 33 of the groove part 300, it is possible to inhibit the electric plane from concentrating between the gate electrode 400 and the drift region 140. Therefore, it is possible to make the semiconductor device 10 have a further higher breakdown voltage.

Fifth Embodiment

Figure 24:
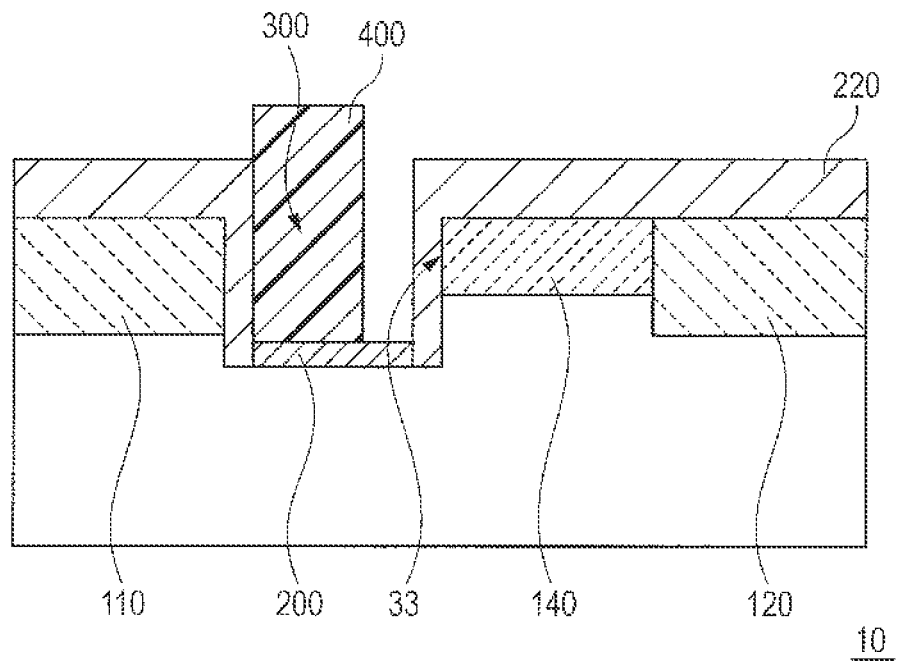
FIG. 24 is a sectional view showing a configuration of a semiconductor device according to a fifth embodiment.

FIG. 24 is a sectional view showing a configuration of the semiconductor device 10 according to a fifth embodiment. The fifth embodiment is the same as the first embodiment and the fourth embodiment except for a point that a void (symbol not illustrated) is provided between the gate electrode 400 and the third plane 33 of the groove part 300.

As in FIG. 24, like the fourth embodiment, the gate electrode 400 is provided separated from the third plane 33 of the groove part 300. In the fifth embodiment, the void (symbol not illustrated) is provided between the gate electrode 400 and the third plane 33 of the groove part 300. A portion of the second gate insulating layer 220 that touches at least the third plane 33 is separated from the gate electrode 400. In other words, the length of the groove part 300 in a direction from the source region 110 to the drain region 120 is longer than a length obtained by summing the length of the gate electrode 400 in the direction and the thickness of the second gate insulating layer 220.

Here, an opening (symbol not illustrated) wider than the gate electrode 400 in a plan view is formed in the second gate insulating layer 220. The first gate insulating layer 200 is formed in the opening.

The first interlayer insulating layer 520 may be formed to cover the gate electrode 400 and the first gate insulating layer 200. At this time, the void (the above-mentioned aperture) of the first interlayer insulating layer 520 may be formed between the gate electrode 400 and the third plane 33 of the groove part 300. Incidentally, the first interlayer insulating layer 520 may be embedded in the void.

According to the fifth embodiment, the same effect as that of the first embodiment and the fourth embodiment can be achieved. Furthermore, according to the fifth embodiment, the void (symbol not illustrated) is provided between the gate electrode 400 and the third plane 33 of the groove part 300. A portion of the second gate insulating layer 220 that touches at least the third plane 33 is separated from the gate electrode 400. Thereby, it is possible to inhibit certainly the electric field from concentrating between the gate electrode 400 and the drift region 140.

Sixth Embodiment

A sixth embodiment is the same as the first embodiment except for a point that the semiconductor substrate 100 is Si.

A structure in a sectional view among structures of the sixth embodiment is the same as that of the first embodiment.

In the sixth embodiment, the semiconductor substrate 100 is a Si substrate, for example. Unlike the first embodiment, a semiconductor layer whose material is different from that of the semiconductor substrate 100 is not formed thereon. That is, a lateral MOSFET is directly formed near the surface of the semiconductor substrate 100.

Moreover, in the case where the first conductivity type is n-type and the semiconductor device 10 contains an re-channel FET, the semiconductor substrate 100 is a p-type Si substrate, for example. On the other hand, in the case where the first conductivity type is p-type and the semiconductor device 10 contains a p-channel FET, the semiconductor substrate 100 may be an n-type Si substrate, for example.

Moreover, a halo region (unillustrated) of a conductivity type reverse to these may further be formed under the source region 110 and the drain region 120.

The gate electrode 400, the source electrode 440, and the drain electrode 460 may be formed with Al and/or TiN, etc. by sputtering like the first embodiment, for example. Alternatively, these electrodes may be formed by embedding Cu by the damascene method. Moreover, these electrodes may be formed by embedding W by CVD.

Moreover, in the case where the semiconductor substrate 100 is Si, a direction going from the source region 110 toward the drain region 120 (the so-called channel length direction) is [100] or [110]. By this, the flat fourth plane 34 on which a crystal plane is exposed can be formed.

According to the sixth embodiment, the same effect as that of the first embodiment can be achieved. Further, according to the sixth embodiment, the semiconductor substrate 100 is a Si substrate. Thereby, it is possible to reduce a cost of the semiconductor substrate 100 and to provide the semiconductor device 10 cheaply. Moreover, an IC for control can be formed successfully on the same chip. Thereby, the semiconductor device 10 is applicable to products of a wider range of forms. Moreover, it is possible to provide the semiconductor device 10 whose breakdown voltage is improved by reducing defects contained in the semiconductor substrate 100.

Seventh Embodiment

Figure 25:
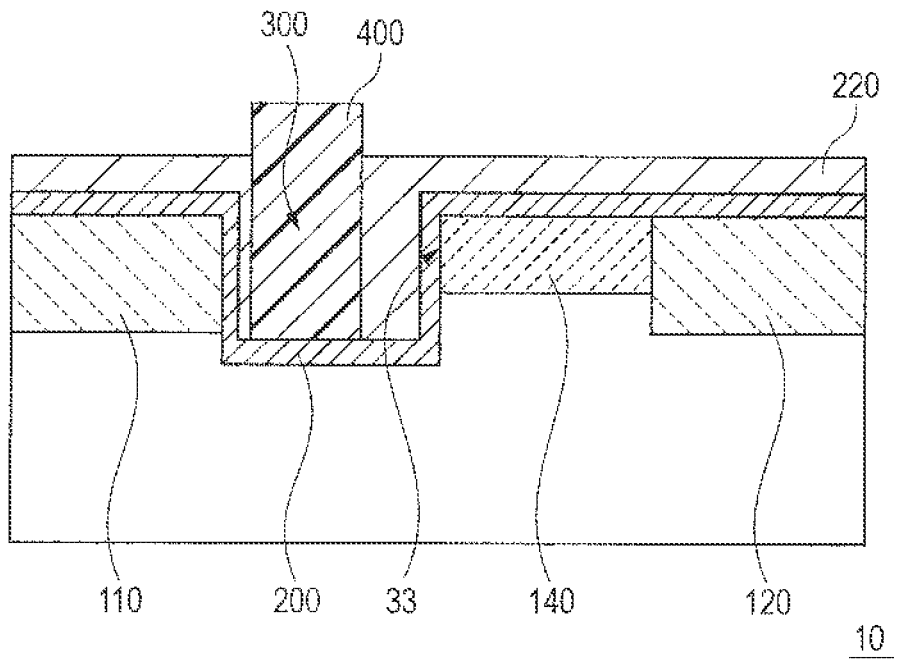
FIG. 25 is a sectional view showing a configuration of a semiconductor device according to a seventh embodiment.

FIG. 25 is a sectional view showing a configuration of the semiconductor device 10 according to a seventh embodiment. The seventh embodiment is the same as the first embodiment or the fifth embodiment except for a point that the second gate insulating layer 220 touches the third plane 33 through the first gate insulating layer 200.

In the seventh embodiment, the semiconductor substrate 100 is a Si substrate, for example. The source region 110, the channel region 130, the drift region 140, and the drain region 120 are formed over the semiconductor substrate 100.

The first gate insulating layer 200 is formed in contact with the first plane 31 of the semiconductor substrate 100 and the interior of the groove part 300. Here, the first gate insulating layer 200 touches the third plane 33.

The second gate insulating layer 220 touches the third plane 33 through the first gate insulating layer 200. In other words, the second gate insulating layer 220 is formed to touch a portion of the first gate insulating layer 200 that touches the third plane 33.

Next, an outline of a method of manufacturing a semiconductor device 10 according to the seventh embodiment will be explained. The method of manufacturing a semiconductor device according to the seventh embodiment is the same as that of the first embodiment and the fourth embodiment except for the following point.

Steps up to FIG. 22A are performed similarly with the fourth embodiment. Next, the first gate insulating layer 200 is formed over the whole surface of the semiconductor substrate 100. Next, the second gate insulating layer 220 is formed over the first gate insulating layer 200. Next, the opening (unillustrated) is formed in a portion of the second gate insulating layer 220 that overlaps the channel region 130 by RIE. Thereby, the first gate insulating layer 200 is exposed in the opening. The following steps are the same as those of the first embodiment and the fourth embodiment.

According to the seventh embodiment, the same effect as that of the first embodiment or the fourth embodiment can be achieved. Further, like the seventh embodiment, the first gate insulating layer 200 can also be formed prior to the second gate insulating layer 220 according to a material of the semiconductor substrate 100.

In the foregoing, although in the sixth and seventh embodiments, the cases where the semiconductor substrate 100 was the Si substrate were explained, the configurations of the first to fifth embodiments may be applied to the both cases.

In the foregoing, although the embodiments of the present invention were described with reference to the drawings, these are exemplifications of the present invention and various configurations other than what were described above can also be adopted.

What is claimed is:

1. A semiconductor device, comprising:
   a semiconductor substrate whose surface is designated as a first plane;
   a groove part provided on the first plane side of the semiconductor substrate;
   a source region of a first conductivity type that faces a second plane that is one of side faces of the groove part and at least a part of which extends in a direction parallel to a nodal line of the first plane and the second plane;
   a drift region of the first conductivity type that faces a third plane being the other side face of the groove part opposite to the second plane, at least a part of which is provided extending in a direction parallel to a nodal line of the first plane and the third plane, and whose concentration is lower than that of the source region;
   a drain region of the first conductivity type that is placed on the other side of the drift region opposite to the groove part and is provided to touch the drift region, and whose concentration is higher than the drift region;
   a channel region that is provided over the semiconductor substrate and is sandwiched by the source region and the drift region in a plan view;
   a first gate insulating layer provided so as to touch a fourth plane that is a plane lying in a direction that intersects the second plane and the third plane among the side faces of the groove part and so as to touch at least the channel region over the first plane, and
   a gate electrode provided over the first gate insulating layer,
   wherein the groove part is formed more deeply than the drift region.

2. The semiconductor device according to claim 1, comprising:
   a plurality of the groove parts that are arranged serially in a direction parallel to a nodal line of the first plane and the second plane and are provided separated from one another,
   wherein the channel region is formed between adjacent groove parts.

3. The semiconductor device according to claim 1, further comprising:
a field plate electrode provided so that it may touch the gate electrode and may overlap the drift region in a plan view,
wherein the film thickness of a part of the first gate insulating layer that touches a top of the drift region is thicker than that of a part thereof that touches a top of the channel region.

4. The semiconductor device according to claim 1,
wherein the gate electrode is provided separated from the third plane of the groove part.

5. The semiconductor device according to claim 4, further comprising:
a second gate insulating layer that touches the third plane and is thicker than the first gate insulating layer.

6. The semiconductor device according to claim 4,
wherein the first gate insulating layer is further provided in contact with the third plane, and
wherein the semiconductor device further comprising a second gate insulating layer that touches the third plane side of the first gate insulating layer.

7. The semiconductor device according to claim 1, further comprising:
an element isolation region that is provided on the first plane side of the semiconductor substrate, is provided to overlap the drift region in a plan view, and is provided separated from the third plane,
wherein the drift region touches the side face on the third plane side and a bottom of the element isolation region.

8. The semiconductor device according to claim 1, further comprising:
an element isolation region provided on the first plane side of the semiconductor substrate,
wherein the depth of the groove part is equal to that of the element isolation region.

9. The semiconductor device according to claim 1,
wherein at least the first plane side of the semiconductor substrate is a group III nitride semiconductor layer, and the source region, the channel region, the drift region, and the drain region are formed in the group III nitride semiconductor layer.

10. The semiconductor device according to claim 9,
wherein the impurity concentration of the channel region is less than or equal to $1 \times 10^{-16}$ atoms/cm$^3$.

11. The semiconductor device according to claim 9,
wherein the group III nitride semiconductor layer is an intrinsic semiconductor.

12. The semiconductor device according to claim 9,
wherein the source region, the drift region, and the drain region are n-type, and the n-type impurity is Si.

13. The semiconductor device according to claim 12,
wherein a p-type impurity region is not formed in a portion placed between the source region and the drain region in the group III nitride semiconductor layer.

14. The semiconductor device according to claim 8,
wherein the group III nitride semiconductor layer among layers of the semiconductor substrate is provided over a base substrate, and
the base substrate is a Si substrate, a sapphire substrate, a SiC substrate, or a GaN substrate.

15. The semiconductor device according to claim 8,
wherein a direction that goes from the source region toward the drain region is a [2-1-10] direction or a [01-10] direction.

16. The semiconductor device according to claim 1,
wherein the semiconductor substrate is a Si substrate.

17. The semiconductor device according to claim 16,
wherein a direction that goes from the source region toward the drain region is a [100] direction or a [110] direction.

* * * * *

UNITED STATES PATENT AND TRADEMARK OFFICE
CERTIFICATE OF CORRECTION

| | |
|---|---|
| PATENT NO. | : 8,748,979 B2 |
| APPLICATION NO. | : 13/666507 |
| DATED | : June 10, 2014 |
| INVENTOR(S) | : Hiroshi Takeda |

Page 1 of 1

It is certified that error appears in the above-identified patent and that said Letters Patent is hereby corrected as shown below:

In the Specification

Column 8, Line 11: Delete "plane" and insert -- plane 34 --

Column 9, Line 35: Delete "region" and insert -- region 12 -- ($2^{nd}$ occurrence)

Column 12, Line 6: Delete "$V_{OUT}$," and insert -- $V_{OUT}$ --

Column 12, Line 18: Delete "device" and insert -- device 10 --

Column 13, Line 13 (Approx.): Delete "asking," and insert -- ashing, --

Column 13, Line 52: Delete "asking," and insert -- ashing, --

Column 14, Line 18: Delete "asking," and insert -- ashing, --

Column 14, Line 62: Delete "asking." and insert -- ashing. --

Column 18, Line 36: Delete "asking," and insert -- ashing, --

Column 20, Line 22: Delete "asking" and insert -- ashing --

Column 23, Line 10-11 (Approx.): Delete "re-channel" and insert -- n-channel --

Signed and Sealed this
Twenty-first Day of October, 2014

Michelle K. Lee
*Deputy Director of the United States Patent and Trademark Office*